United States Patent
Yamada et al.

(10) Patent No.: US 9,854,708 B2
(45) Date of Patent: Dec. 26, 2017

(54) UNIT FOR SEMICONDUCTOR DEVICE

(71) Applicant: FUJI ELECTRIC CO., LTD., Kawasaki-shi, Kanagawa (JP)

(72) Inventors: Takafumi Yamada, Matsumoto (JP); Tetsuya Inaba, Matsumoto (JP); Yoshinari Ikeda, Matsumoto (JP); Katsuhiko Yanagawa, Hino (JP); Yoshikazu Takahashi, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/525,780

(22) Filed: Oct. 28, 2014

(65) Prior Publication Data

US 2015/0109738 A1  Apr. 23, 2015

Related U.S. Application Data

(62) Division of application No. 13/500,034, filed as application No. PCT/JP2010/073795 on Dec. 28, 2010, now Pat. No. 8,907,477.

(30) Foreign Application Priority Data

Jan. 5, 2010 (JP) ................. 2010-000470

(51) Int. Cl.
*H01L 23/433* (2006.01)
*H05K 7/20* (2006.01)
*H01L 25/11* (2006.01)
*H01L 25/18* (2006.01)
*H01L 23/498* (2006.01)
*H05K 7/02* (2006.01)
*H01L 23/31* (2006.01)
*H01L 23/40* (2006.01)

(52) U.S. Cl.
CPC ..... *H05K 7/20509* (2013.01); *H01L 23/4334* (2013.01); *H01L 23/49811* (2013.01); *H01L 25/115* (2013.01); *H01L 25/18* (2013.01); *H05K 7/02* (2013.01); *H01L 23/3121* (2013.01); *H01L 23/4006* (2013.01); *H01L 2224/01* (2013.01); *H01L 2924/0002* (2013.01)

(58) Field of Classification Search
CPC ....... H01L 2924/00; H01L 2924/00014; H01L 2224/32225; H01L 2924/00012; H01L 2224/97; H01L 2224/48091; H01L 2224/48247; H01L 2924/181

See application file for complete search history.

(56) References Cited

FOREIGN PATENT DOCUMENTS

JP    2005-064852    *  3/2009

* cited by examiner

*Primary Examiner* — Tony Tran
(74) *Attorney, Agent, or Firm* — Manabu Kanesaka

(57) ABSTRACT

A semiconductor device has a single unit capable of improving adhesion to a cooling body and a heat dissipation performance, and an aggregate of the single units is capable of configuring any circuit at a low cost. A single unit includes copper blocks, an insulating substrate with a conductive pattern, an IGBT chip, a diode chip, a collector terminal pin, implant pins fixed to the chips by solder, a printed circuit board having the implant pins fixed thereto, an emitter terminal pin, a control terminal pin, a collector terminal pin, and a resin case having the above-mentioned components sealed therein. The copper blocks make it possible to improve adhesion to a cooling body and the heat dissipation performance. A plurality of single units can be combined with an inter-unit wiring board to form any circuit.

12 Claims, 17 Drawing Sheets

UNIT FOR SEMICONDUCTOR DEVICE

CROSS-REFERENCE TO RELATED APPLICATION

This is a divisional Application of Ser. No. 13/500,034 filed on Jun. 4, 2012, which is a PCT National Phase of PCT/JP2010/073795 filed on Dec. 28, 2010, which in turn claims a priority of Japanese Patent Application No. 2010-000470 filed on Jan. 5, 2010.

TECHNICAL FIELD

The present invention relates to a unit for a semiconductor device having a semiconductor chip sealed therein.

BACKGROUND ART

For example, in general, a motor is used in a driving source, such as an electric vehicle, and the motor is controlled by an inverter device. A power semiconductor element, such as an insulated gate bipolar transistor (IGBT) or a power metal-oxide-semiconductor field-effect transistor (MOSFET), is used in the main circuit of the inverter device. Patent Literature 1 discloses an inverter bridge module in which a plurality of power semiconductor elements is connected to form a three-phase inverter bridge.

FIGS. 17(a), 17(b) are diagrams illustrating the structure of the inverter bridge module disclosed in Patent Literature 1. FIG. 17(a) is a perspective view illustrating the module and FIG. 17(b) is a perspective view illustrating the IGBT unit.

The inverter bridge module is formed by arranging sealed IGBT units 54a to 54f in a matrix of three rows and two columns on a heat sink 53 and connecting the IGBT units 54a to 54f to a P bus bar 51 and an N bus bar 52. A P terminal 51a and an N terminal 52a are exposed and protrude from the side surface of the unit.

In the inverter bridge module, the P bus bar 51 and the N bus bar 52 are arranged in parallel to each other to reduce line inductance.

In FIGS. 17(a), 17(b), reference numeral 55 indicates a first collector terminal, reference numeral 56 indicates a first emitter terminal, reference numeral 57 indicates a second collector terminal, and reference numeral 59 indicates a case.

Patent Literature 2 discloses a top-open-type assembly case in which discrete products of two sets of semiconductor modules are collectively accommodated such that a use number of semiconductor modules are aligned in a direction, thereby forming an integrated unit.

Patent Literature 3 discloses a printed circuit board which is assembled so as to overlap the main switching element.

Patent Literature 4 discloses a structure in which a semiconductor module is fixed to a heat sink or a radiator plate by screws which are inserted from a reinforcing beam into screw through holes of the semiconductor module through the reinforcing beam and a pressing leaf spring.

CITATION LIST

Patent Literature

Patent Literature 1: Japanese Patent Application Laid-Open No. 2007-236044

Patent Literature 2: Japanese Patent Application Laid-Open No. 2001-36005

Patent Literature 3: Japanese Patent No. 3430192

Patent Literature 4: Japanese Patent No. 4129027

DISCLOSURE OF INVENTION

Problem to be Solved by the Invention

As described above, when the IGBT units or the discrete products can be combined with each other to form semiconductor modules with various capacities, it is possible to reduce the stock of parts and provide a semiconductor module at a low cost.

However, in Patent Literature 1, since the IGBT units are individually attached to the bus bar for wiring, the attachment process is complicated, which results in an increase in manufacturing costs.

In addition, since the IGBT unit is bolted to the heat sink by only one terminal of a plurality of terminals of the IGBT, the distribution of adhesion to the heat sink is not uniform and the heat dissipation performance is insufficient.

In addition, since a heat spreader is not arranged on the collector side of the IGBT unit, it is difficult to uniformly dissipate heat from the IGBT unit to the heat sink (cooling body).

Patent Literatures 2 to 4 do not disclose a semiconductor device according to the invention in which units are collectively aggregated to improve adhesion to the heat sink and the heat dissipation performance.

Since a large amount of current flows to a semiconductor device, such as a power semiconductor module, a method of cooling the semiconductor device is important. However, a structure that brings a semiconductor device including units for a semiconductor device into close contact with a cooling body to uniformly cool each unit has not been examined.

The invention has been made in view of the above-mentioned problems and an object of the invention is to provide a unit for a semiconductor device capable of improving adhesion to a cooling body and a heat dissipation performance and a semiconductor device which is an aggregate of the units and is capable of forming any circuit at a low cost.

Means for Solving Problem

In order to achieve the object, according to a first aspect of the invention, there is provided a unit for a semiconductor device including: an insulating substrate including one surface having a first conductive pattern formed and the other surface having a second conductive pattern formed; a first conductive block fixed to the first conductive pattern by solder; a second conductive block fixed to the second conductive pattern by solder; a semiconductor chip including one surface fixed to the second conductive block by solder; a plurality of implant pins fixed to the other surface of the semiconductor chip by solder; a printed circuit board having a third conductive pattern formed, the implant pins being fixed thereon; a first external lead terminal fixed to the second conductive block; a second external lead terminal fixed to the third conductive pattern and electrically connected to the implant pins; and a resin case sealed such that the first conductive block is exposed from a first surface thereof and the ends of the first external lead terminal and the second external lead terminal protrude from a second surface opposite to the first surface.

Therefore, in the unit for a semiconductor device according to the first aspect, the semiconductor chip is fixed to the insulating substrate having the first conductive block and the second conductive block fixed to both surfaces thereof. In addition, the first conductive block is exposed from one surface of the unit, and the first external lead terminal and the second external lead terminal protrude from the other surface.

According to a second aspect of the invention, there is provided a unit for a semiconductor device including: an insulating substrate including one surface having a first conductive pattern formed and the other surface having a second conductive pattern formed; a first conductive block fixed to the first conductive pattern by solder; a second conductive block fixed to the second conductive pattern by solder; a semiconductor chip including one surface fixed to the second conductive block by solder; a plurality of implant pins fixed to the other surface of the semiconductor chip by solder; a printed circuit board having a third conductive pattern formed, the implant pins being fixed thereon; two first external lead terminals fixed to the second conductive block; two second external lead terminals fixed to the third conductive pattern and electrically connected to the implant pins; and a resin case sealed such that the first conductive block is exposed from a first surface thereof, the ends of the first external lead terminals protrude from a second surface adjacent to the first surface and a third surface opposite to the second surface, and the ends of the second external lead terminals protrude from a fourth surface adjacent to the first surface and a fifth surface opposite to the fourth surface.

Therefore, in the unit for a semiconductor device according to the second aspect, the semiconductor chip is fixed to the insulating substrate having the first conductive block and the second conductive block fixed to both surfaces thereof. In addition, the first conductive block is exposed from one surface of the unit, and the first external lead terminal and the second external lead terminal protrude from other surfaces adjacent to the one surface.

According to a third aspect of the invention, there is provided a semiconductor device including: a plurality of the units for a semiconductor device according to the first aspect; a wiring substrate provided on one side of an aggregate of the units for a semiconductor device and is electrically connected to the first external lead terminals and the second external lead terminals and on which a wiring pattern for wiring between the units for a semiconductor device is formed; and attachment members sandwiching an aggregate of the units for the semiconductor device from two side surfaces and having holes to fix the aggregate of the units for the semiconductor device to a cooling body with the wiring substrate by screwing bolts.

Therefore, the semiconductor device according to the invention is used such that the aggregate of the units for a semiconductor device is fixed to the cooling body by the wiring substrate and the attachment members.

According to a fourth aspect of the invention, there is provided a semiconductor device including: a plurality of units for a semiconductor device according to the second aspect; connection members that connect the first external lead terminals, connect the second external lead terminals, and connect the first external lead terminal and the second external lead terminal in the adjacent units for a semiconductor device, thereby forming a circuit, and connect the units for a semiconductor device; and attachment members sandwiching an aggregate of the units for the semiconductor device from two side surfaces and having holes to fix the aggregate of the units for the semiconductor device to a cooling body.

Therefore, the semiconductor device according to the fourth aspect is used such that the aggregate of the units for a semiconductor device connected by the connection members is fixed to the cooling body by the attachment members.

According to a fifth aspect of the invention, there is provided a semiconductor device including: a plurality of units for a semiconductor device according to the first aspect; a wiring substrate which is provided on one side of an aggregate of the units for a semiconductor device and is electrically connected to the first external lead terminals and the second external lead terminals and on which a wiring pattern for wiring between the units for a semiconductor device is formed; attachment members sandwiching an aggregate of the units for the semiconductor device from two side surfaces and having holes to fix the aggregate of the units for the semiconductor device to a cooling body with the wiring substrate by screwing bolts; and an adhesive that fixes the units for a semiconductor device and fixes the units for a semiconductor device and the attachment members.

Therefore, the semiconductor device according to the fifth aspect is used such that the aggregate of the unit for a semiconductor device fixed by the adhesive is fixed to the cooling body by the wiring substrate and the attachment members.

Effect of the Invention

According to the invention, since the semiconductor chip is fixed to the insulating substrate having the conductive blocks attached to both surfaces thereof, it is possible to provide a unit for a semiconductor device capable of improving adhesion to a cooling body and the heat dissipation performance.

That is, in the unit for a semiconductor device according to the invention, since the conductive blocks are fixed to both surfaces of the insulating substrate, it is possible to effectively dissipate heat generated from the semiconductor chip to the cooling body. In addition, the warping of the insulating substrate due to heat is reduced. It is possible to prevent the breaking of the semiconductor chip fixed to one conductive block and maintain the contact between the other conductive block and the cooling body. As a result, it is possible to reduce contact thermal resistance during use.

Since the semiconductor chip and the emitter terminal pin (external lead terminal) are connected to each other through the printed circuit board having a plurality of implant pins fixed thereto, it is possible to reduce the thermal stress of a fixing portion, as compared to the structure in which the emitter terminal pin is directly fixed to the semiconductor chip. As a result, it is possible to improve heat cycle resistance or temperature cycle resistance. In addition, since the printed circuit board with the implant pins is used, the unit for a semiconductor device can be manufactured by one reflow process.

Since the collector terminal pin and the emitter terminal pin of the unit for a semiconductor device are drawn from the upper surface of the resin case, the units can be arranged such that the side surfaces thereof contact with each other or are close to each other, thereby forming an arbitrary combination of the units, that is, an arbitrary aggregate of the units. The aggregate of the units can be combined with the wiring substrate to form an arbitrary capacitance or circuit. In this way, it is possible to provide a semiconductor device including a desired circuit, such as an inverter circuit, a converter circuit, or a chopper circuit, at a low cost.

The collector terminal pin and the emitter terminal pin of the unit for a semiconductor device may be drawn from the side surfaces of the resin case. In this case, the units can be arranged such that the side surfaces thereof contact with each other or are close to each other, thereby forming an arbitrary combination of the units, that is, an arbitrary aggregate of the units. The aggregate of the units can be combined with the wiring substrate. In this way, it is possible to provide a semiconductor device including an arbitrary capacity or circuit at a low cost.

The semiconductor device according to the invention includes the insulating substrate having the copper blocks fixed to both surfaces thereof, and the units for a semiconductor device that have low thermal resistance and are less likely to warp are fixed to the cooling body by the wiring substrate and the attachment members. The semiconductor device has high reliability and low manufacturing costs.

The above-mentioned object, other objects, advantages, and features of the invention may be understood more readily by reference to the following detailed description of preferred embodiments and the accompanying drawings.

BRIEF DESCRIPTION OF THE DRAWINGS

FIGS. 1(a) and 1(b) are diagrams illustrating the structure of a unit for a semiconductor device according to a first embodiment of the invention, wherein FIG. 1(a) is a perspective view illustrating a main portion and FIG. 1(b) is conceptual cross-sectional view.

FIGS. 13(a) and 13(b) are diagrams illustrating the structure of a unit for a semiconductor device according to a third embodiment of the invention, wherein FIG. 13(a) is a perspective view illustrating a main portion and FIG. 13(b) is a conceptual cross-sectional view.

FIGS. 15(a) to 15(e) are diagrams illustrating a joint used when the units for a semiconductor device are assembled to form a unit aggregate, wherein FIG. 15(a) is a perspective view illustrating the joint and a single unit, FIGS. 15(b) to 15(d) are cross-sectional views mainly illustrating the insertion of a terminal pin and a connection terminal pin into the joint, and FIG. 15(e) is a cross-sectional view mainly illustrating a case in which the joint made of metal is used.

FIGS. 16(a) and 16(b) are diagrams illustrating the structure of a semiconductor device according to a fifth embodiment of the invention, wherein FIG. 16(a) is a plan view illustrating a main portion and FIG. 16(b) is a cross-sectional view illustrating a main portion.

FIGS. 17(a) and 17(b) are diagrams illustrating the structure of an inverter bridge module disclosed in Patent Literature 1, wherein FIG. 17(a) is a perspective view illustrating the inverter bridge module and FIG. 17(b) is a perspective view illustrating an IGBT unit.

BEST MODE FOR CARRYING OUT THE INVENTION

Hereinafter, exemplary embodiments of the invention will be described.

Embodiment 1

(Structure of Unit for Semiconductor Device)

Figure 1:
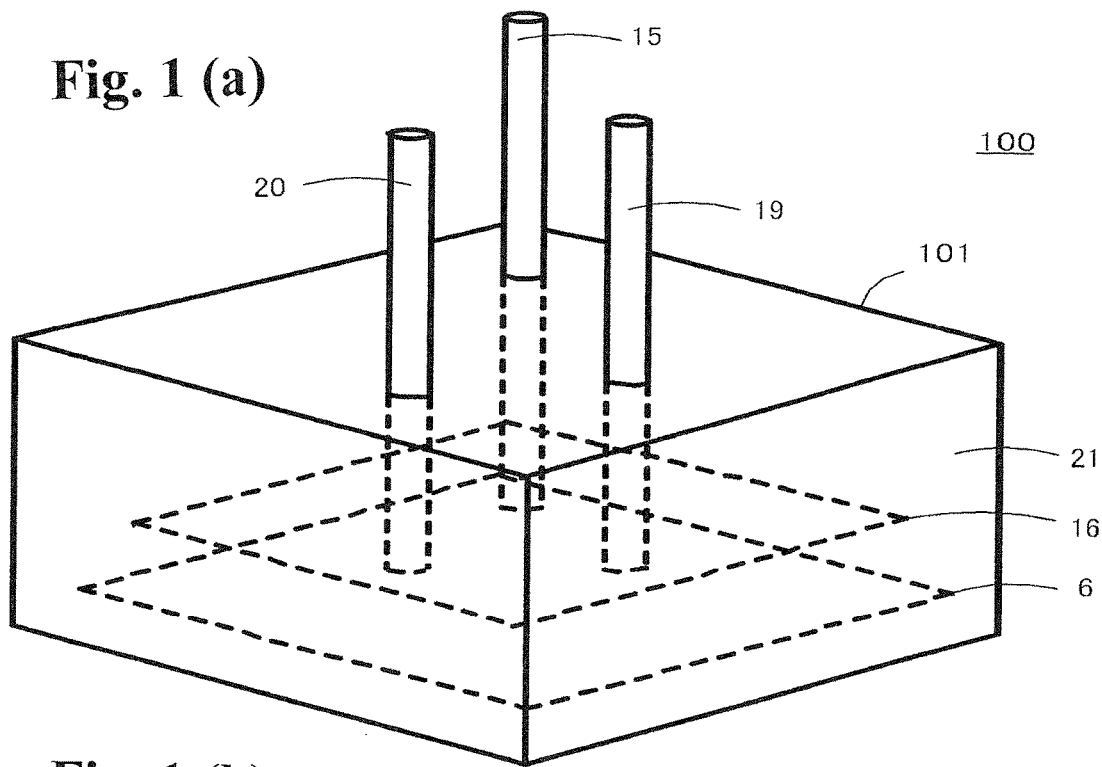
Figure 1:
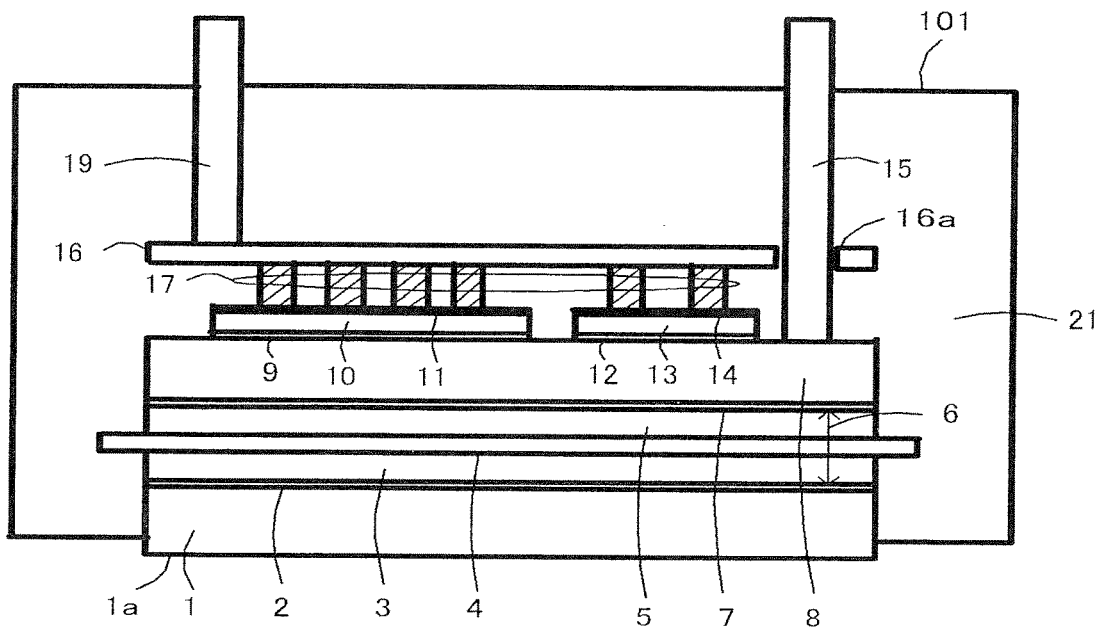

FIGS. 1(a) and 1(b) are diagrams illustrating the structure of a unit for a semiconductor device according to a first embodiment of the invention. FIG. 1(a) is a perspective view illustrating a main portion and FIG. 1(b) is a conceptual cross-sectional view. The conceptual cross-sectional view of FIG. 1(b) is not taken along a specific cutting line of FIG. 1(a) and a control terminal pin 20 shown in FIG. 1(a) is not shown in FIG. 1(b). A unit 100 for a semiconductor device according to this embodiment includes, for example, a unit 101 having an IGBT chip 10 and a free wheeling diode chip (hereinafter, simply referred to as a diode chip 13) provided in a resin case 21.

The unit 101 includes at least an insulating substrate 6 with a conductive pattern, a first copper block 1, a second copper block 8, the IGBT chip 10, the diode chip 13, an implant-pin-type printed circuit board 16 (hereinafter, simply referred to as a printed circuit board 16), a collector terminal pin 15, an emitter terminal pin 19, and the resin case 21. The insulating substrate 6 with a conductive pattern includes an insulating substrate 4, a conductive pattern 3 that is provided on the front surface of the insulating substrate 4, and a conductive pattern 5 that is provided on the rear surface of the insulating substrate 4. The first copper block 1 and the second copper block 8 are fixed to the conductive pattern 3 and the conductive pattern 5 by solder materials 2 and 7, respectively. The first copper block 1 contacts with a cooling body (not shown) that is arranged below the unit 101. The IGBT chip 10 and the diode chip 13 are fixed to the second copper block 8 by solder materials 9 and 12, respectively. In addition, the collector terminal pin 15 is fixed as a first external lead terminal to the second copper block 8. Another conductive pattern (not shown) is formed on the implant-pin-type printed circuit board 16. A plurality of implant pins 17 is fixed to the conductive pattern. The implant pins 17 are fixed to emitter and gate electrodes (not shown) of the IGBT chip 10 through solder 11 and are fixed to an anode electrode (not shown) of the diode chip 13 through solder 14. The emitter terminal pin 19 and the control terminal pin 20 are fixed as the second external lead terminals to a surface of the printed circuit board 16 opposite to the surface to which the implant pins 17 are fixed so as to be electrically connected to the emitter electrode and the gate electrode through the conductive pattern, respectively. The insulating substrate 6 with a conductive pattern, the first copper block 1, the second copper block 8, the IGBT chip 10, the diode chip 13, the printed circuit board 16, the implant pins 17, the collector terminal pin 15, and the emitter terminal pin 19 are sealed in the resin case 21 such that a rear surface 1a of the first copper block 1 is exposed from the lower side of the resin case 21 and the ends of the collector terminal pin 15 and the emitter terminal pin 19 are exposed from the upper side thereof. The IGBT chip 10 and the diode chip 13 are electrically connected in inverse parallel to each other through the second copper block 8 and the conductive pattern formed on the printed circuit board 16, thereby forming one arm. The single unit 100 for a semiconductor device functions as a semiconductor device.

(Method of Manufacturing Unit for Semiconductor Device)

FIGS. 2(a), 2(b) and 3(c), 3(d) are cross-sectional views illustrating the main process of a method of manufacturing the unit for a semiconductor device shown in FIGS. 1(a) and 1(b).

Figure 2:
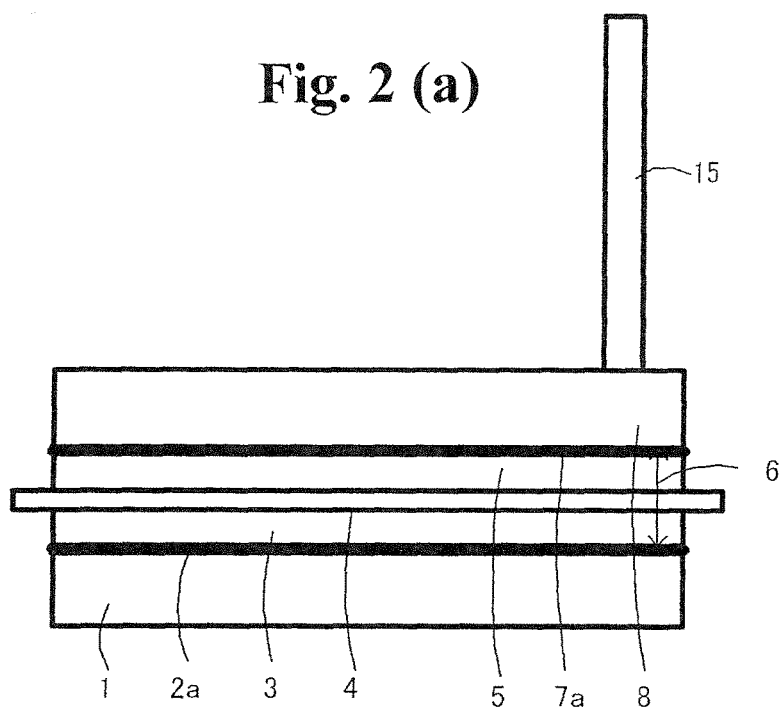
FIGS. 2(a), 2(b) are cross-sectional views illustrating a main process of manufacturing the unit for a semiconductor device shown in FIGS. 1(a), 1(b).
Figure 2:
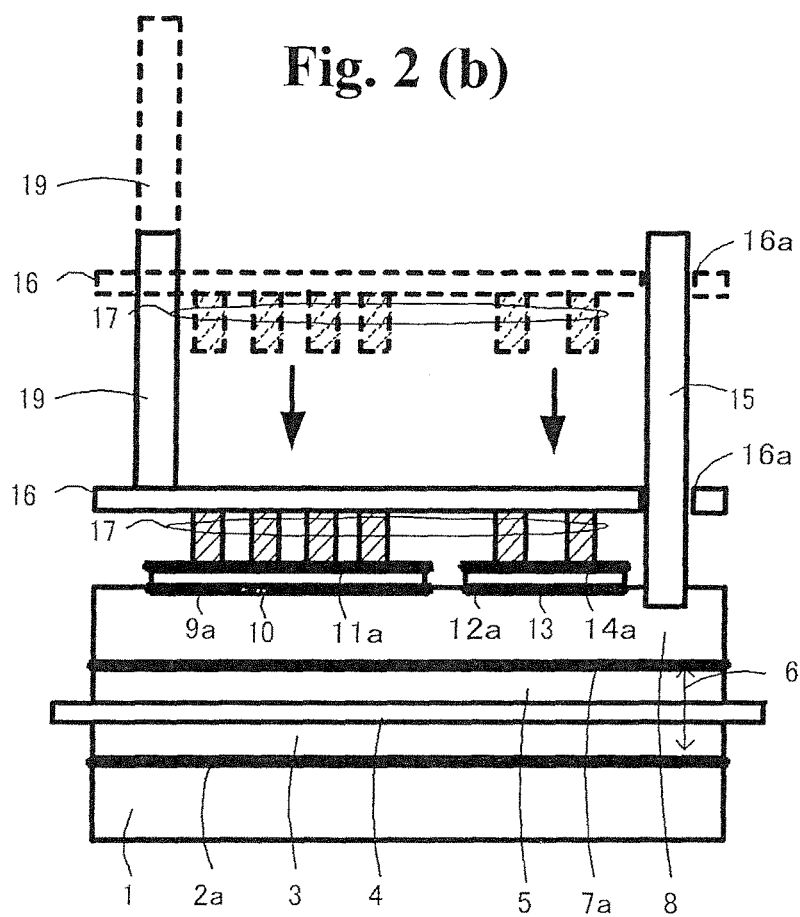

As shown in FIG. 2(a), the first copper block 1, the second copper block 8 to which the collector terminal pin 15 is fixed, and the insulating substrate 6 with a conductive pattern (for example, a direct bonding copper substrate) in which the conductive patterns 3 and 5 are formed on both surfaces of the insulating substrate 4 are prepared. In this embodiment, each of the first copper block 1 and the second copper block 8 has a substantially rectangular parallelepiped shape. First, the insulating substrate 6 with a conductive pattern is mounted on the first lower copper block 1 with a solder plate 2a interposed therebetween and the second copper block 8 is mounted on the conductive pattern 5 on the insulating substrate 6 with a conductive pattern with a solder plate 7a interposed therebetween.

The collector terminal pin 15 is fixed by, for example, forming a concave portion (not shown) in the second copper block 8, inserting the collector terminal pin 15 into the concave portion, and soldering the collector terminal pin 15.

Then, as represented by a dashed line in FIG. 2(b), the printed circuit board 16 in which the emitter terminal pin 19 and the control terminal pin 20 (not shown) are fixed to the upper side and a plurality of implant pins 17 is fixed to the lower side is prepared. Then, the IGBT chip 10 is mounted on the second copper block 8 through one solder plate 9a, with the collector electrode (not shown) facing downward. In addition, the diode chip 13 is mounted on the second copper block 8 through one solder plate 12a, with a cathode electrode (not shown) facing downward. One solder plate 11a is mounted in the range from the emitter electrode (not shown) to the gate electrode of the IGBT chip 10 and one solder plate 14a is mounted on an anode electrode (not shown) of the diode chip 13. Then, as represented by a solid line in FIG. 2(b), the collector terminal pin 15 passes through a through hole 16a formed in the printed circuit board 16 and the printed circuit board 16 is moved down such that the leading ends of the implant pins 17 contact the solder plates 11a and 14a. The emitter terminal pin 19 is connected to the emitter electrode of the IGBT chip 10 through the conductive pattern and the implant pins 17 fixed to the printed circuit board 16. At the same time, the emitter terminal pin 19 is connected to the anode electrode of the diode chip 13 through the implant pins 17.

A conductive pattern (circuit pattern) to which the emitter terminal pin 19, the control terminal pin 20, and the implant pins 17 are connected is formed on the printed circuit board 16. The leading end of each of the emitter terminal pin 19, the control terminal pin 20, and the implant pins 17 are inserted into through holes (not shown) which are formed in the conductive pattern of the printed circuit board 16 and then fixed thereto by solder. In addition, the through hole 16a through which the collector terminal pin 15 passes is formed in the printed circuit board 16 so as to be separated from the conductive pattern.

Figure 3:
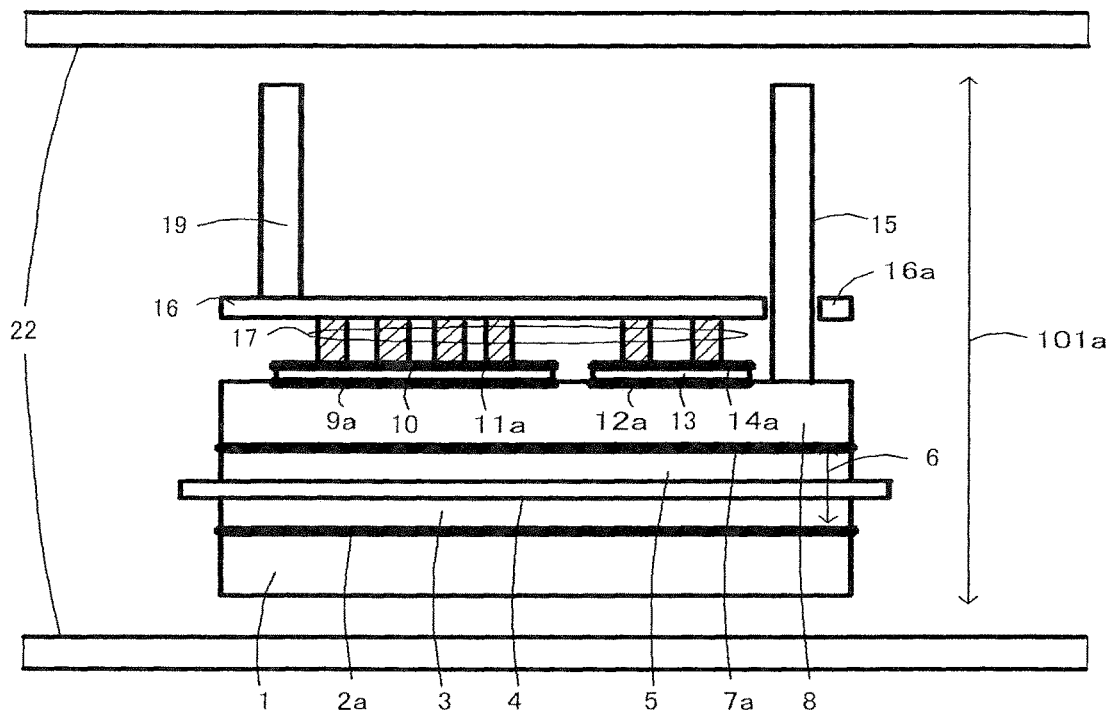
FIGS. 3(c), 3(d) are cross-sectional views illustrating the main process of manufacturing the unit for a semiconductor device shown in FIGS. 1(a) and 1(b), which follow FIGS. 2(a), 2(b).
Figure 3:
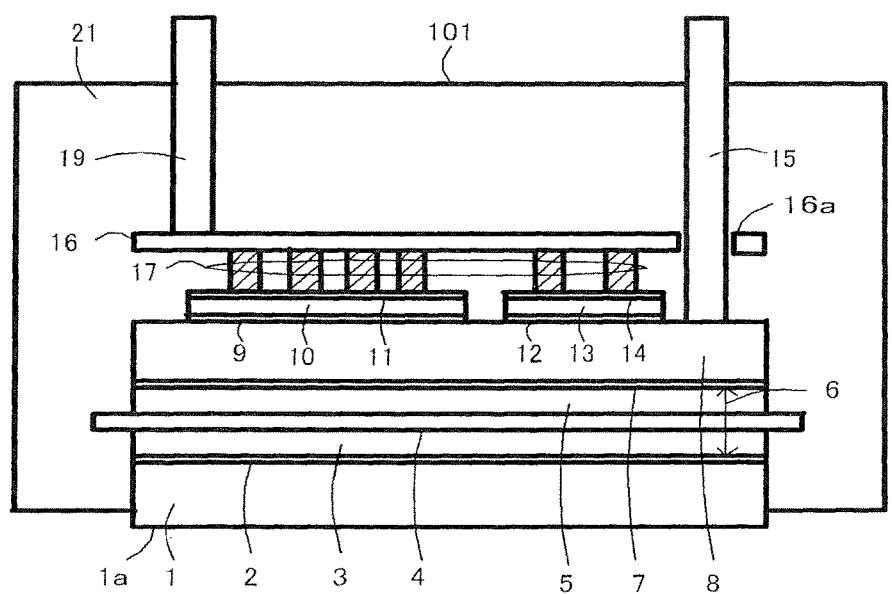

Then, as shown in FIG. 3(c), a laminate 101a of the first copper block 1, the solder plate 2a, the insulating substrate 6 with a conductive pattern, the solder plate 7a, the second copper block 8, the solder plates 9a and 12a, the IGBT chip 10, the diode chip 13, the solder plates 11a and 14a, and the printed circuit board 16 having the terminal pins 15, 19, and 20 and the implant pins 17 fixed thereto is put into a reflow furnace 22 and the solder plates 2a, 7a, 9a, 11a, 12a, and 14a are melted. After the melting process, the laminate is cooled to fix the contact surfaces of the first copper block 1, the insulating substrate 6 with a conductive pattern, the second copper block 8, the IGBT chip 10, and the diode chip 13. In this case, when the solder plate 11a provided in the range from the emitter electrode to the gate electrode of the IGBT chip 10 is melted, it is divided by a surface protective film, for example, a polyimide film which covers the space between the emitter electrode and the gate electrode and solder is placed on the electrodes after cooling.

Then, as shown in FIG. 3(d), soldering is performed and the integrated laminate 101a is taken out from the reflow furnace 22. The rear surface 1a of the first copper block 1 and the ends of the emitter terminal pin 19, the collector terminal pin 15, and the control terminal pin 20 are exposed and sealed by a resin. In this way, the unit 101 with a substantially rectangular parallelepiped shape, for example, a cubic shape which is covered with the resin case 21 is completed.

As described above, the first copper block 1 and the second copper block 8 are fixed to both surfaces of the insulating substrate 6 with a conductive pattern by the solder materials 2 and 7. In this way, heat generated from the IGBT chip 10 and the diode chip 13 is spread and transferred downward to the copper blocks 1 and 8 and it is possible to effectively transfer heat to a cooling body (not shown). It is preferable that the first copper block 1 and the second copper block 8 have sizes capable of preventing the warping of the insulating substrate and obtaining a sufficient heat dissipation effect. For example, it is preferable that a vertical line extending from the end of the IGBT chip 10 to one side of the rear surface 1a of the first copper block 1 pass through the lower surface of the second copper block 8 and the angle formed between the vertical line and the main surface of the IGBT chip 10 be equal to or less than 45°. In addition, it is preferable that the planar dimensions of the second copper block 8 be less than those of the first copper block 1 in order to prevent the peeling-off of the conductive pattern 5. The use of the copper blocks makes it possible to reduce thermal resistance by several tens of percent, as compared to a semiconductor device according to the related art in which an insulating substrate and a semiconductor chip are sequentially fixed to a metal base.

In addition, since the copper blocks 1 and 8 with the same dimensions are fixed to both surfaces of the insulating substrate 6 with a conductive pattern, it is possible to prevent the warping of the insulating substrate 6 with a conductive pattern due to heat generated from the IGBT chip 10 and the diode chip 13. As a result, it is possible to prevent, for example, the breaking of the chip. In addition, the adhesion between the first copper block 1 and the cooling body (not shown) is improved and it is possible to improve heat dissipation efficiency.

The exposed surface (rear surface 1a) of the first copper block 1 is polished and planarized. Therefore, it is possible to reduce contact thermal resistance with the cooling body.

Since the printed circuit board 16 having a plurality of implant pins 17 is interposed, the external lead terminal (for example, the emitter terminal pin 19 or the control terminal pin 20) is connected to the chip electrode (the emitter electrode or the gate electrode) by the plurality of implant pins 17. As a result, it is possible to increase resistance to thermal stress (for example, heat cycle resistance or temperature cycle resistance), compared to the structure in which the external lead terminal is directly fixed to the chip electrode, and reduce the thermal fatigue of the solder materials 11 and 14. Therefore, it is possible to improve reliability. In addition, a bonding process may not be performed and it is possible to manufacture the unit 100 for a semiconductor device with one reflow process.

Since the printed circuit board 16 is used, it is possible to easily change the arrangement of the external lead terminals connected to the chip electrodes only by changing the conductive pattern formed on the printed circuit board 16.

Since the conductive patterns 3 and 5 are formed on the upper and lower surfaces of the insulating substrate 4, it is possible to prevent the warping of the insulating substrate 6 with a conductive pattern due to heat. In this case, the figure of the conductive pattern 5 formed on the front surface of the insulating substrate and the figure of the conductive pattern 3 formed on the rear surface of the insulating substrate may be formed in a shape having a projection mirror relation therebetween.

(Other Units for a Semiconductor Device)

Then, a unit 102 different from that shown in FIGS. 1(a), 1(b) will be described.

Figure 4:
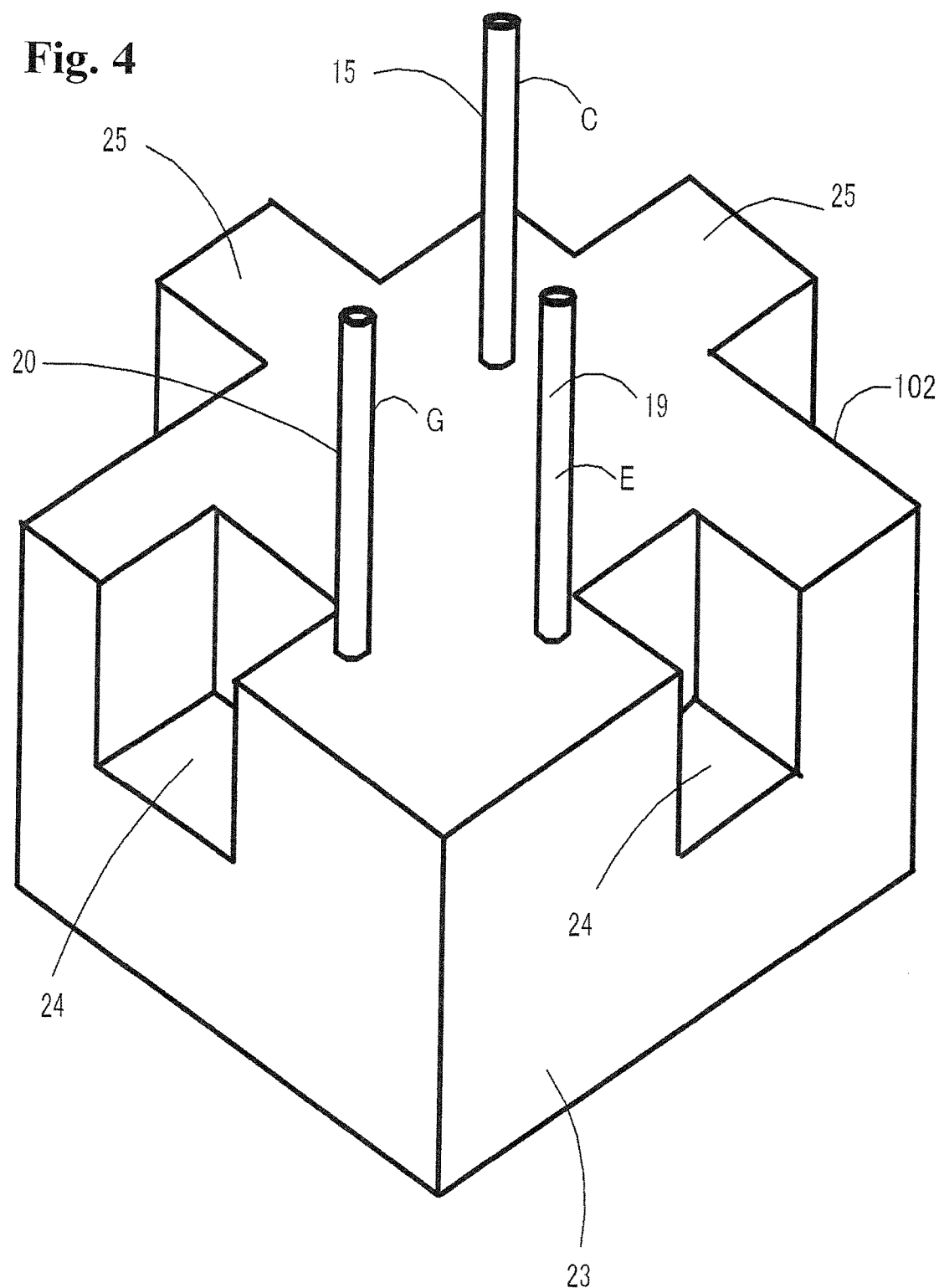
FIG. 4 is a perspective view illustrating a main portion of the unit for a semiconductor device in which a concave portion and a convex portion are formed on the side surfaces.

FIG. 4 is a cross-sectional view illustrating a main portion of the unit 102 in which a concave portion and a convex portion are formed on the side surfaces. In this example, in the unit 102 having a substantially rectangular parallelepiped shape, concave portions 24 are formed in adjacent side surfaces of a resin case 23 and convex portions 25 are formed on side surfaces opposite to the side surfaces. According to this structure, when a unit aggregate 201, which will be described below, is configured, the units 102 are contacted and combined with each other such that the convex portion 25 is fitted to the concave portion 24, which makes it possible to prevent the positional deviation between the units 102 in the vertical and horizontal directions. In particular, this structure is effective in preventing the deviation between the units 102 due to heat generated during the use of the semiconductor device.

In the first embodiment, a set of the IGBT chip 10 and the diode chip 13 is given as an example of the semiconductor chips provided in the units 101 and 102, but the invention is not limited thereto. The unit for a semiconductor device may be configured so as to accommodate only the IGBT chip 10, only the diode chip 13, or chips other than the IGBT chip 10 and the diode chip 13, for example, one or two or more power MOSFET chips, power bipolar transistor chips, or thyristor chips. The chips may be determined for the purpose of use.

When the unit includes only the diode chip 13, the control terminal pin 20 is not needed.

Embodiment 2

(Structure of Semiconductor Device)

Figure 5:
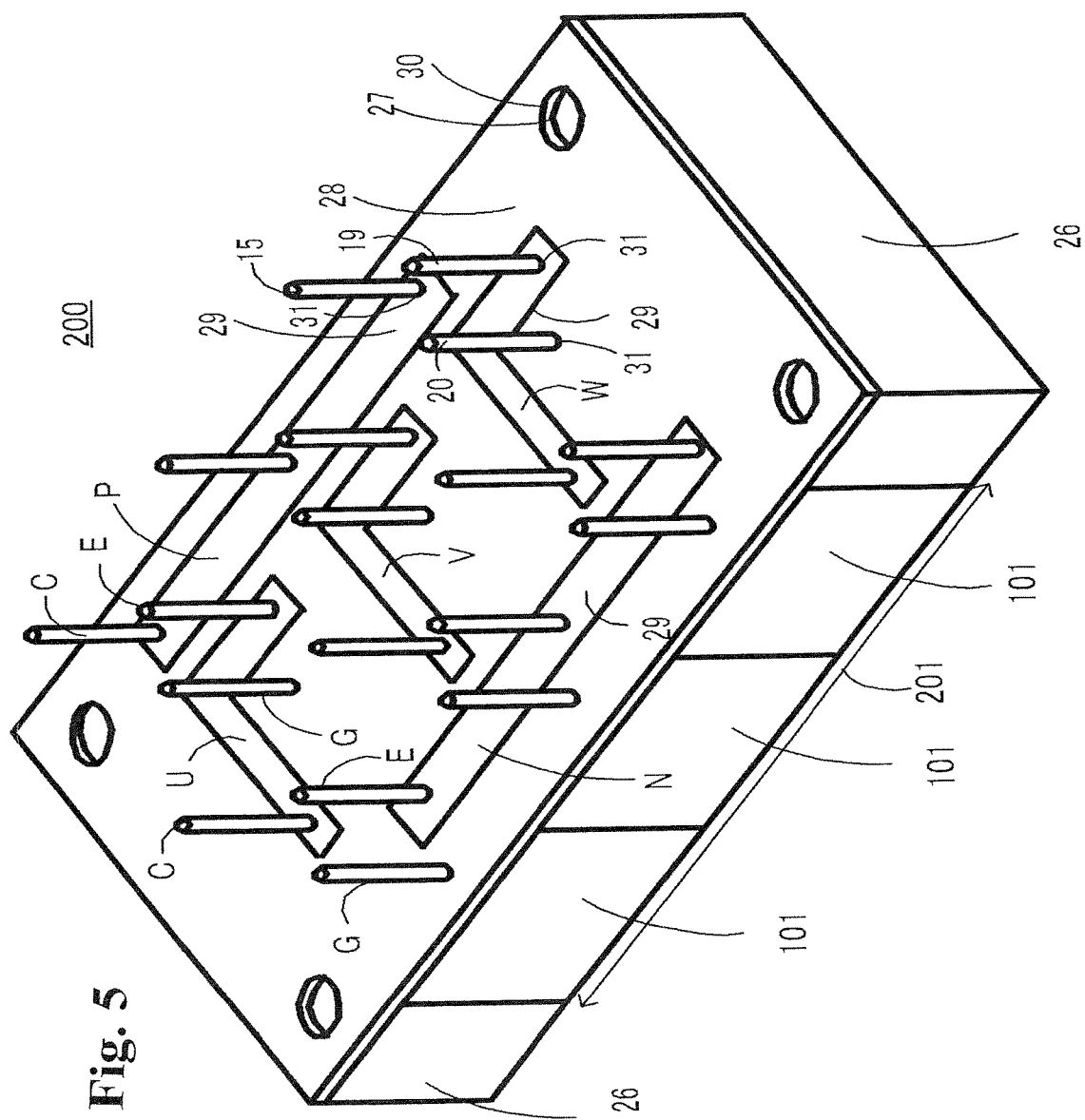
FIG. 5 is a perspective view illustrating a main portion of a semiconductor device according to a second embodiment of the invention.

FIG. 5 is a perspective view illustrating a main portion of a semiconductor device according to a second embodiment of the invention. A semiconductor device 200 is a power IGBT module. For example, one power IGBT module can form a three-phase inverter circuit shown in FIG. 6.

The semiconductor device 200 includes a unit aggregate 201 including the units 101 according to the first embodiment (FIGS. 1(a) and 1(b)), a wiring substrate 28, and bolting units 26 (fastening members) having the unit aggregate 201 interposed between both sides thereof.

The wiring substrate 28 is an insulating substrate with a conductive pattern in which a wiring pattern 29 forming a circuit, for example, an inverter circuit is formed on an insulating substrate by a conductive film. In addition, the wiring substrate 28 presses the unit aggregate 201 against a cooling body (not shown). Therefore, the wiring substrate 28 needs to have rigidity.

The terminal pins 15, 19, and 20 are inserted into through holes 31 formed in the wiring substrate 28 and are fixed to the wiring pattern 29 or a conductive film (not shown) formed on the side walls of the through holes in the wiring substrate.

The above will be described in detail below with reference to FIG. 5.

Figure 6:
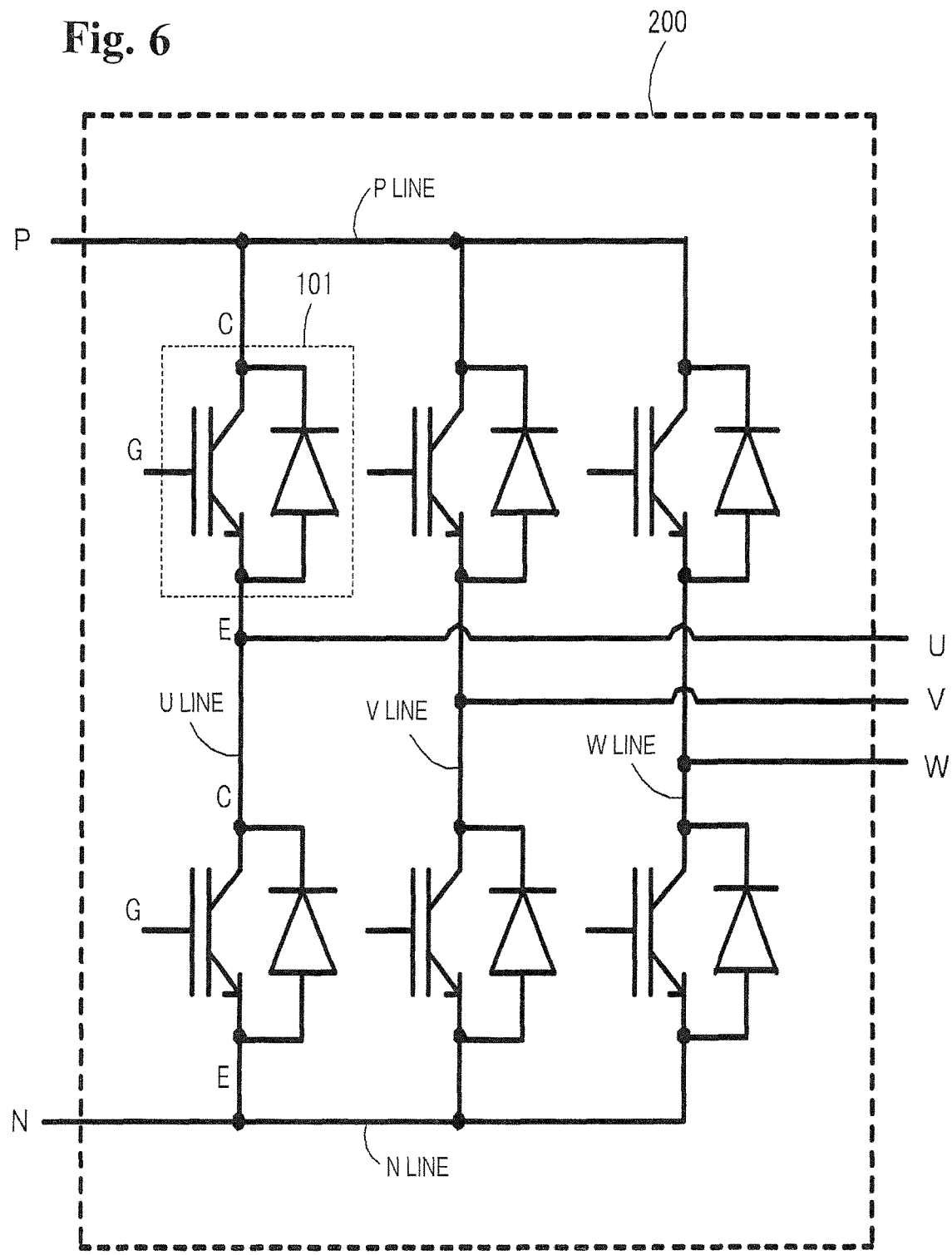
FIG. 6 is a circuit diagram illustrating a three-phase inverter.

The unit aggregate 201 includes six units 101 and the wiring substrate 28 for wiring between the units 101 is provided on the unit aggregate 201. The emitter terminal pin 19, the collector terminal pin 15, and the control terminal pin 20 pass through the through holes 31 of the wiring substrate 28 and are then fixed by solder. The wiring patterns 29, such as a P line, an N line, a U line, a V line, and a W line, which are wiring lines of the three-phase inverter circuit shown in FIG. 6, are formed by a conductive film on the wiring substrate 28. The emitter terminal pins 19 and the collector terminal pins 15 passing through the through holes 31 of the wiring patterns 29 are fixed by solder. The control terminal pin 20 is insulated from the wiring pattern 29, passes through another through hole 31 formed in an insulating substrate of the wiring substrate 28, and is fixed to a conductive film formed on the inner wall of the through hole 31 by solder.

Preferably, the leading ends of the terminal pins 15, 19, and 20 may be formed as spade-shaped connection portions or banana-shaped connection portions (banana plugs) and the connection portions may be inserted into the through holes 31 of the wiring substrate 28 and then fixed. After the connection portions are fixed, they may be soldered to be firmly fixed.

The six units 101 form the unit aggregate 201 of two rows and three columns. That is, three units are closely arranged in a row and two rows of the units are closely arranged. The bolting units 26, which are attachment members, are arranged on two opposite side surfaces of the unit aggregate 201. In addition, the wiring substrate 28 is arranged on the unit aggregate 201 and the bolting units 26 such that through holes 27 formed in the bolting units 26 overlap through holes 30 formed at four corners of the wiring substrate. The unit aggregate 201, the bolting unit 26, and the wiring substrate 28 are fixed to the cooling body by bolts (not shown) which are inserted into the through holes 27 and 30.

Figure 7:
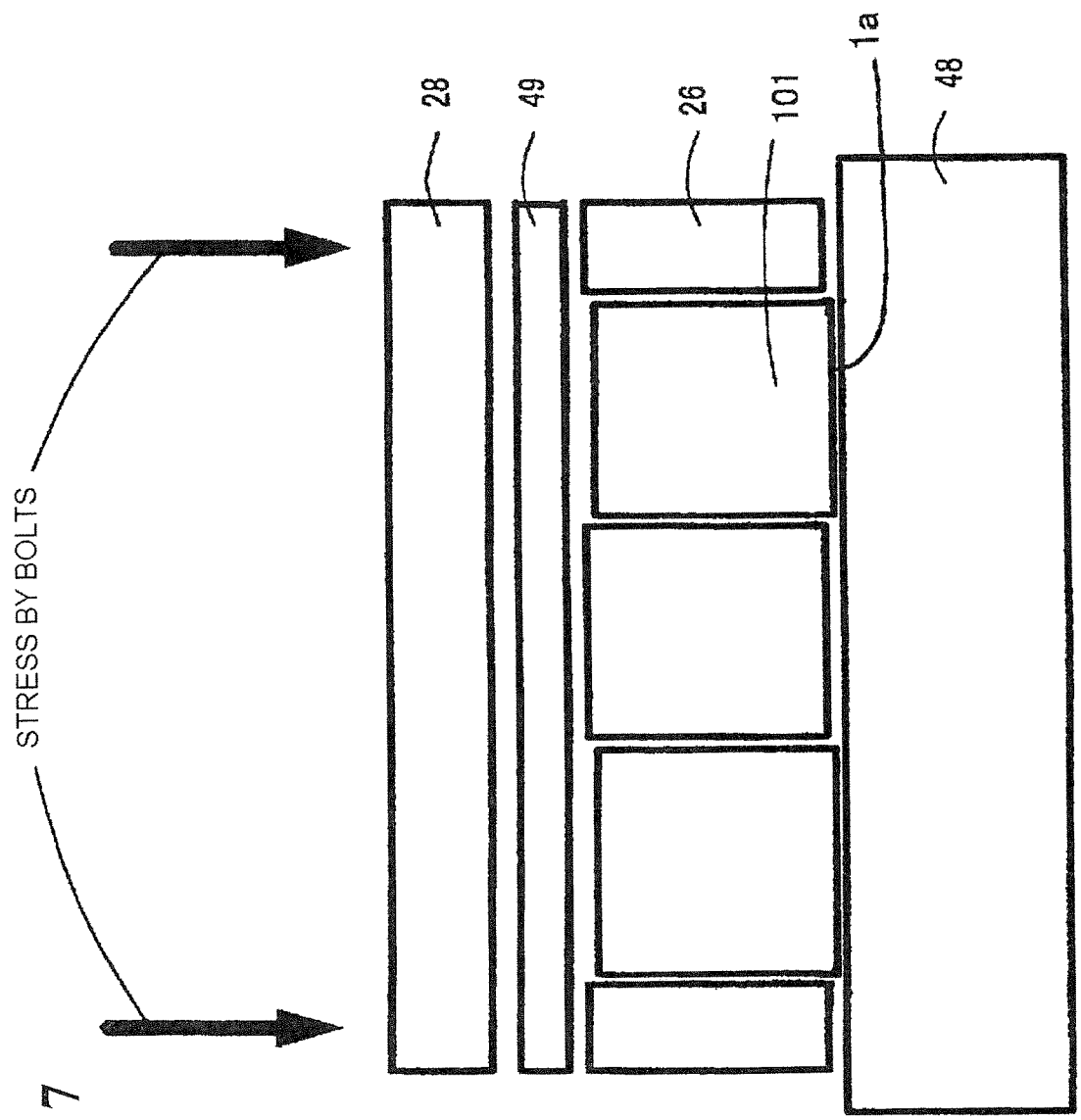
FIG. 7 is a cross-sectional view mainly illustrating an elastic body interposed between a wiring substrate and an aggregate of the units for a semiconductor device.

FIG. 7 is a cross-sectional view mainly illustrating an elastic body interposed between the wiring substrate and a unit aggregate for a semiconductor device. As shown in FIG. 7, it is preferable that an elastic body 49, such as a rubber sheet, be interposed between the wiring substrate 28 and the unit aggregate 201 (unit for a semiconductor device). When the elastic body 49 is interposed, it is possible to arrange the rear surfaces 1a of the first copper blocks 1 which are exposed in an uneven state at the same height during bolting.

Therefore, the rear surface 1a of the first copper block 1 in each unit 101 comes into close contact with the cooling body 48 and it is possible to reduce the contact thermal resistance between the semiconductor device 200 and the cooling body 48 during use. Instead of the elastic body 49, a spring that presses each unit 101 may be inserted. In this case, it is possible to obtain the same effect as described above. When a compound is interposed between the unit aggregate 201 and the cooling body (not shown), it is possible to reduce the contact thermal resistance.

(Method of Manufacturing Semiconductor Device)

Figure 8:
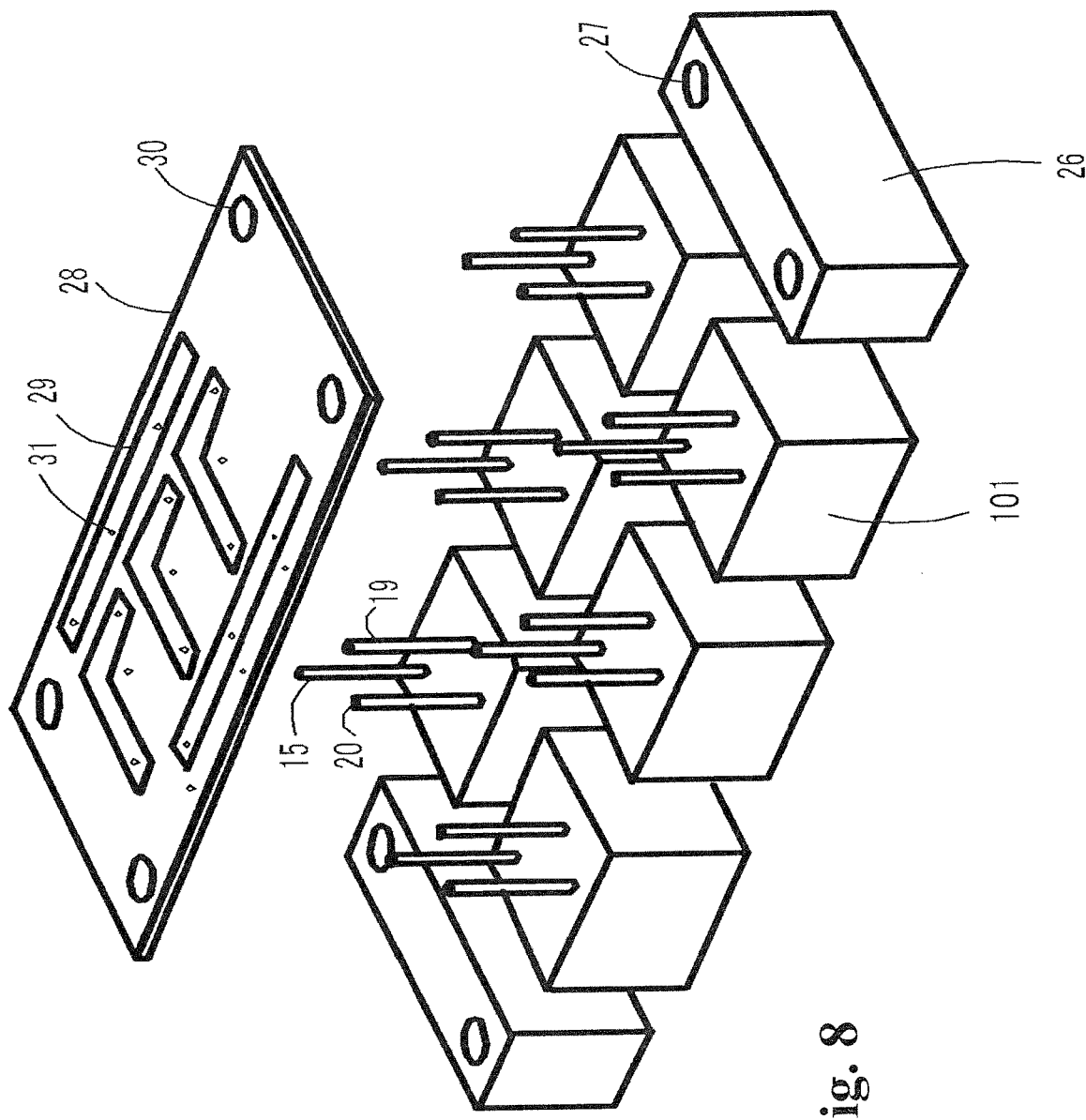
FIG. 8 is a perspective view illustrating a main process of manufacturing the semiconductor device shown in FIG. 5.
Figure 9:
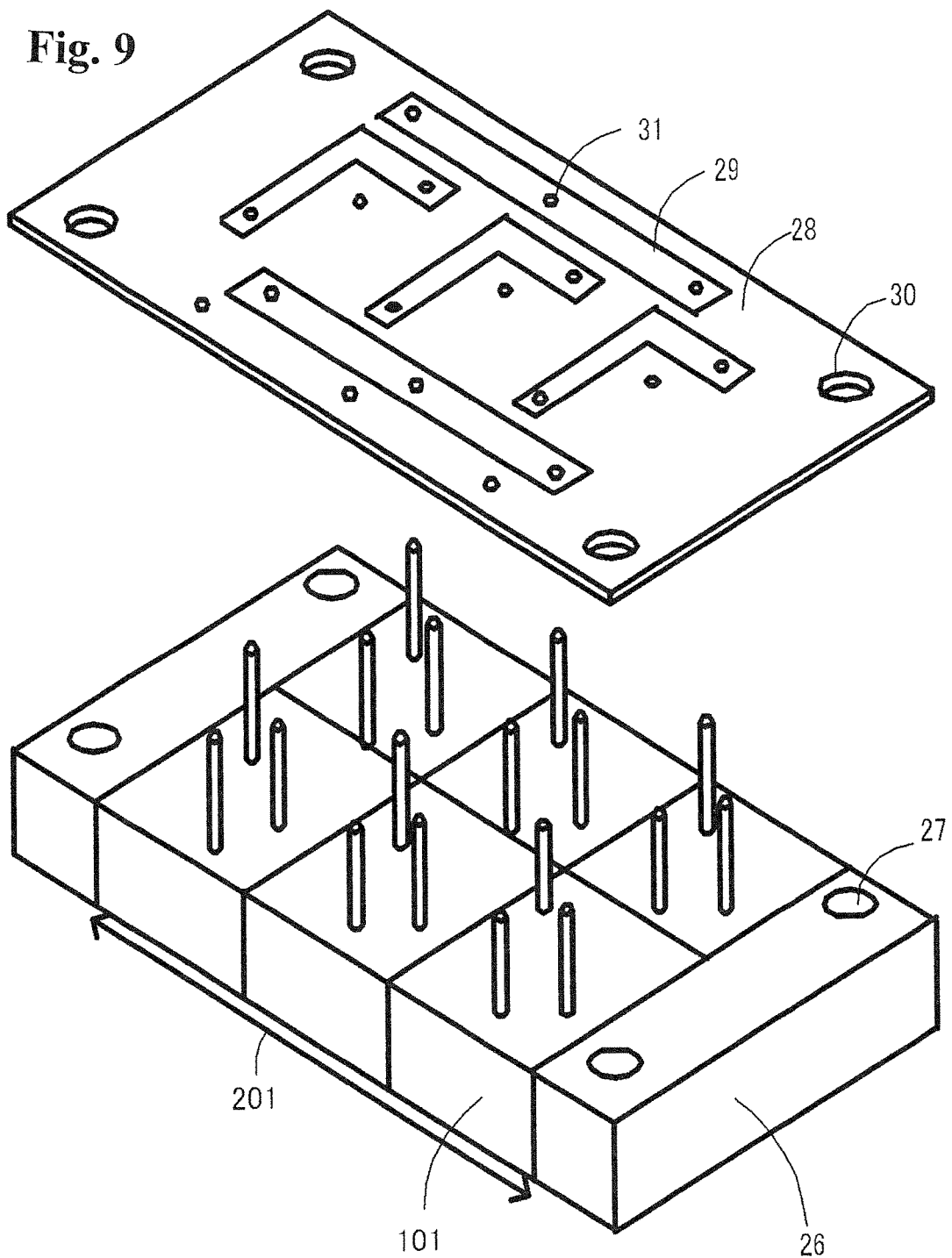
FIG. 9 is a perspective view illustrating the main process of manufacturing the semiconductor device shown in FIG. 5, which follows FIG. 8.
Figure 10:
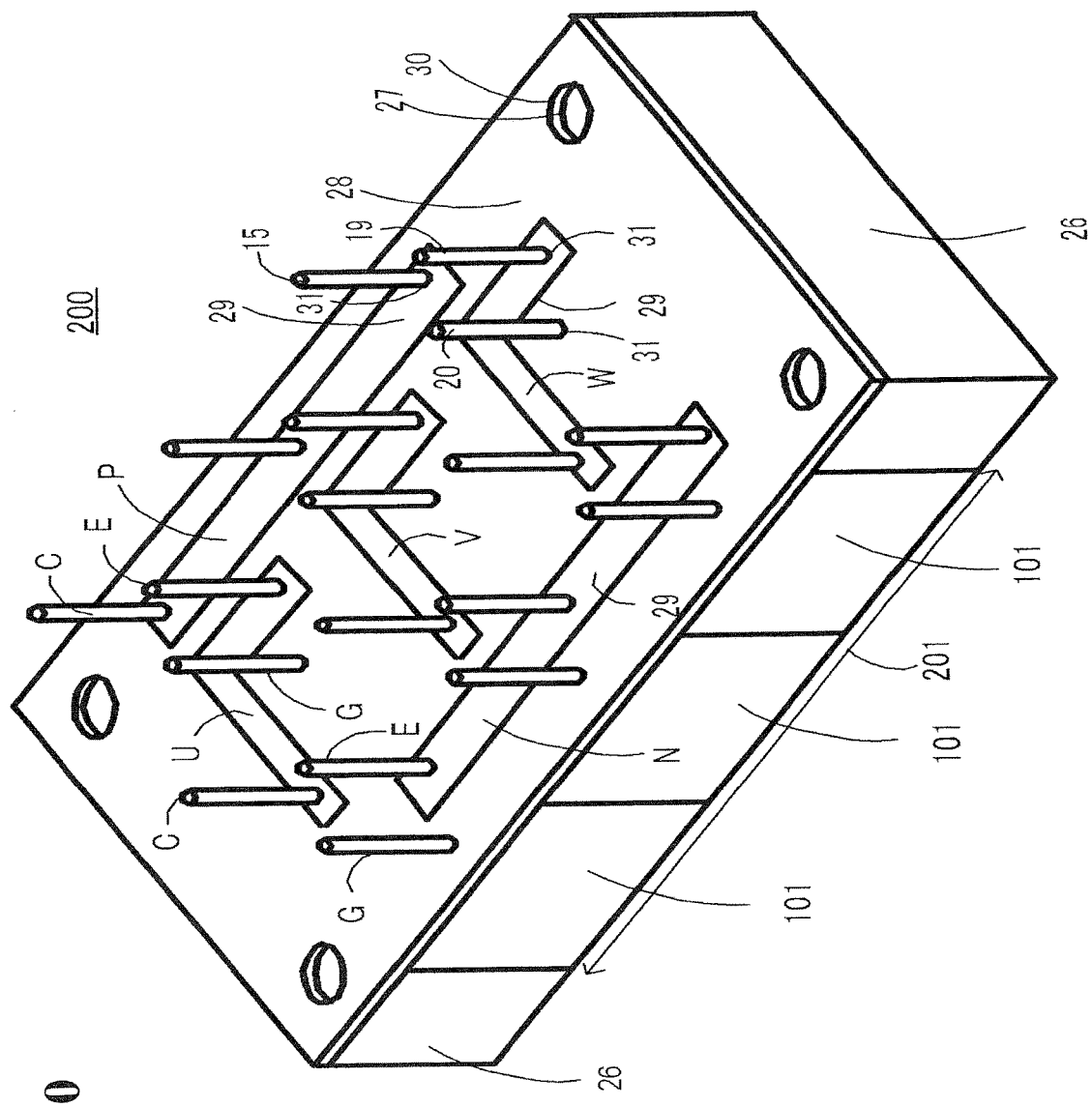
FIG. 10 is a perspective view illustrating the main process of manufacturing the semiconductor device shown in FIG. 5, which follows FIG. 9.

FIGS. 8 to 10 are perspective views illustrating the main processes of a method of manufacturing the semiconductor device shown in FIG. 5.

As shown in FIG. 8, six units 101, two bolting units 26, and one wiring substrate 28 are prepared.

As shown in FIG. 9, two sets of three units 101 which are closely arranged in a row are closely arranged in parallel to form the unit aggregate 201. The bolting units 26 are arranged such that the unit aggregate 201 is interposed between the bolting units 26 in the longitudinal direction. Then, the wiring substrate 28 is arranged on the bolting units 26 and the unit aggregate 201.

Then, as shown in FIG. 10, the upper wiring substrate 28 is moved down such that the terminal pins 15, 19, and 20 pass through the through holes 31 of the wiring substrate 28. Then, the through holes 31 are covered by solder to fix the terminal pins 15, 19, and 20 and the wiring substrate 28. In this way, the unit aggregate 201 and the wiring substrate 28 are electrically and mechanically connected to each other. Then, the rear surfaces 1a of the first copper blocks 1 exposed from the units 101 are grinded and polished such that the rear surfaces 1a of the six first copper blocks 1 have the same height. In this way, the power IGBT module (semiconductor device 200) including the unit aggregate 201, the wiring substrate 28, and the bolting units 26 is completed.

Figure 11:
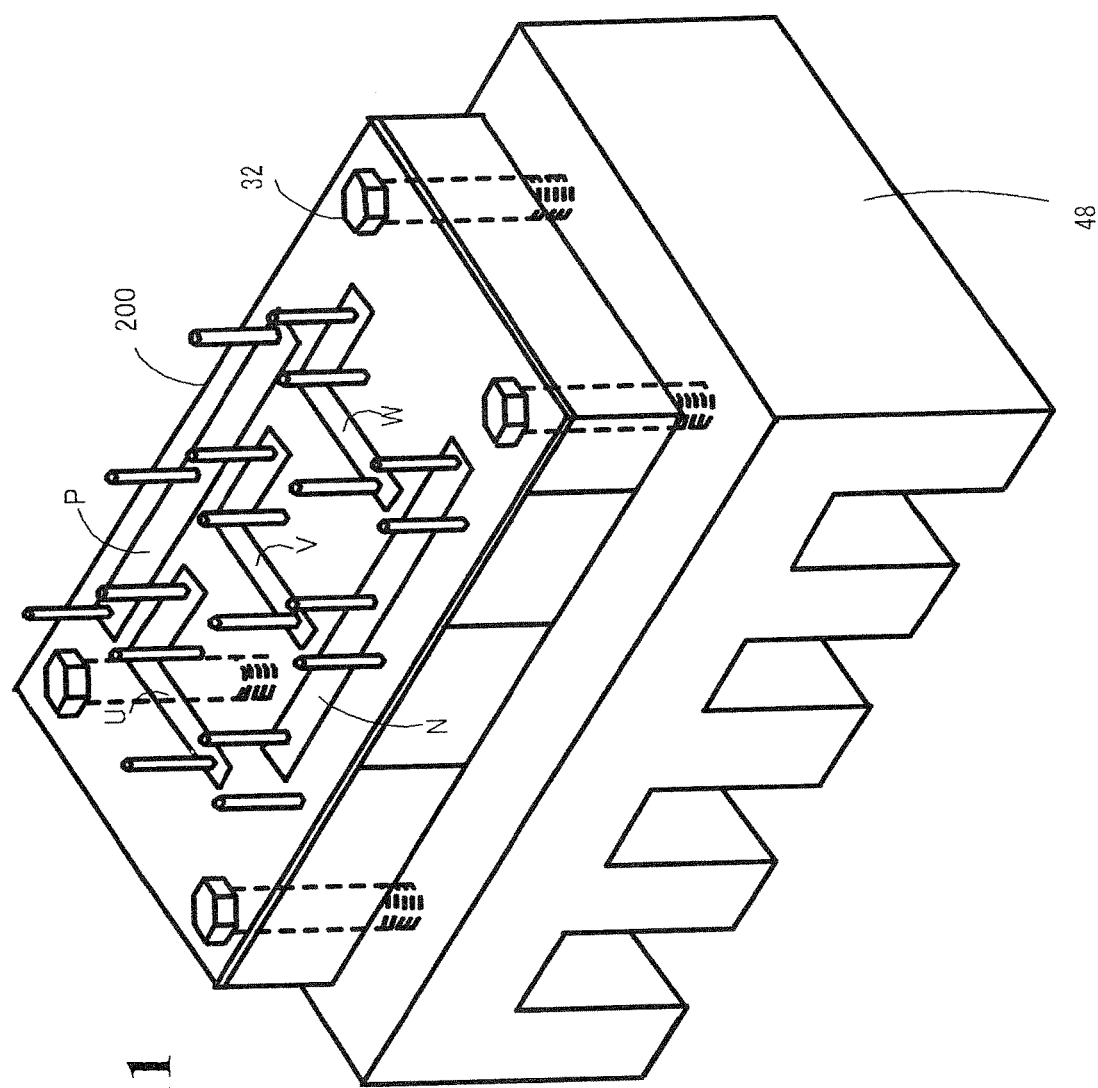
FIG. 11 is a perspective view illustrating a use state in which the semiconductor device is attached to a cooling body.

FIG. 11 is a perspective view mainly illustrating the usage state of the semiconductor device 200 with a cooling body (cooling fin). The semiconductor device 200 is fixed to a cooling body 48 by bolts 32 inserted into the through holes 30 of the wiring substrate 28 and the through holes 27 of the bolting units 26 which are coaxially arranged. Preferably, a compound or thermally-conductive paste is coated on a surface of the cooling body 48 facing the semiconductor device 200. The fastening torque of the bolts 32 is transmitted as pressure contact force from the wiring substrate 28 to each unit 101 through the terminal pins 15, 19, and 20. Each unit 101 is pressed against the cooling body 48 by the pressure contact force. In this way, the rear surface 1a of the first copper block 1 in each unit 101 comes into close contact with the cooling body 48 and is fixed thereto.

As such, the wiring substrate 28 has a function of forming wiring lines between the units 101 in order to form a desired circuit and a function of bringing each unit 101 into close contact with the cooling body 48.

(Other Semiconductor Devices)

Next, a power IGBT module which is assembled using the unit 102 shown in FIG. 4 will be described.

Figure 12:
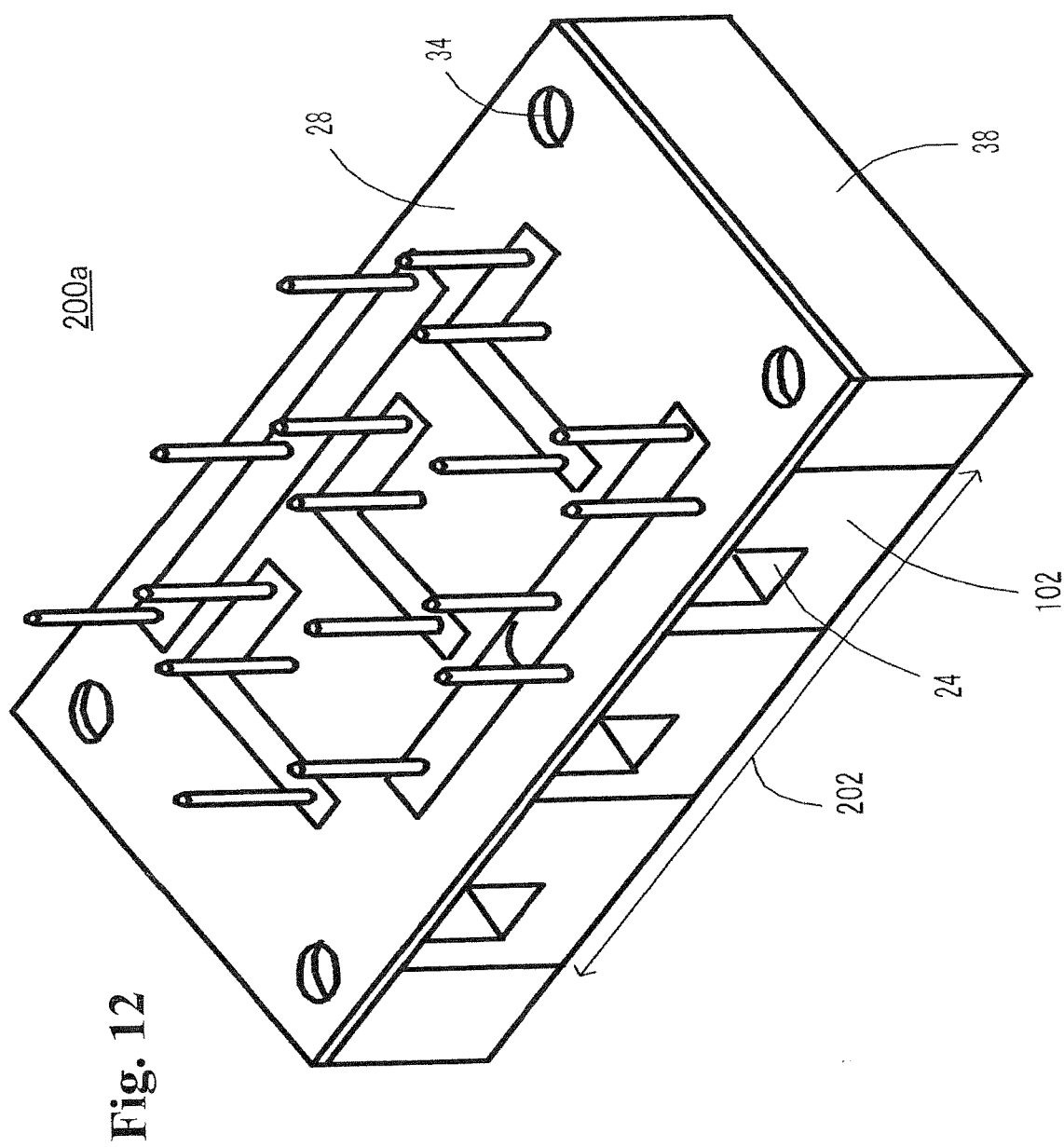
FIG. 12 is a perspective view illustrating the semiconductor device assembled using the semiconductor device unit shown in FIG. 4 in which concave and convex portions are formed on the side walls.

FIG. 12 is a perspective view illustrating a semiconductor device 200a which is assembled using the unit 102 shown in FIG. 4 in which the concave portion 24 and the convex portion 25 are provided on the side surface. The convex portion 25 (see FIG. 4) formed on the side surface of the unit 102 is fitted to the concave portion 24 formed in the side surface of another unit 102. In this way, it is possible to form a unit aggregate 202 including the units 102 which are strongly connected to each other. In addition, although not shown in the drawings, a convex portion is formed on a side surface of one bolting unit 38 which faces the surface of the unit 102 in which the concave portion 24 is formed and a concave portion is formed in a side surface of the other bolting unit 38 which faces the unit 102 on which the convex portion is formed. Then, the convex portion is fitted to the concave portion. In this way, it is possible to strongly connect the unit 102 and the bolting unit 38.

Embodiment 3

Figure 13:
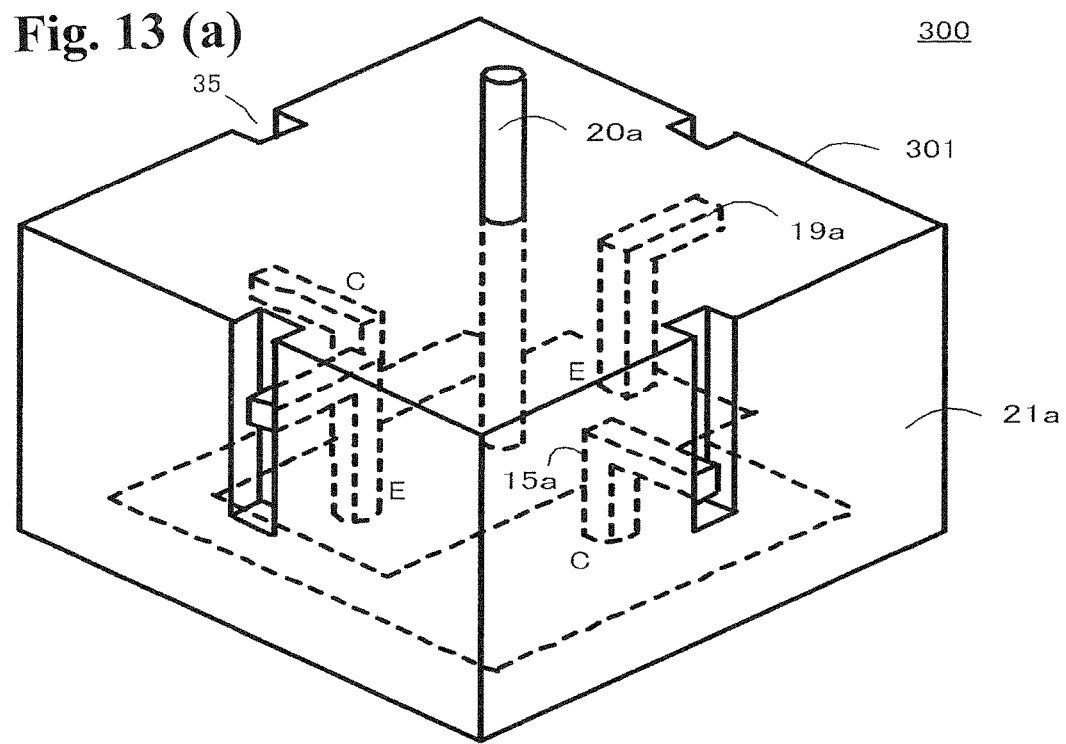
Figure 13:
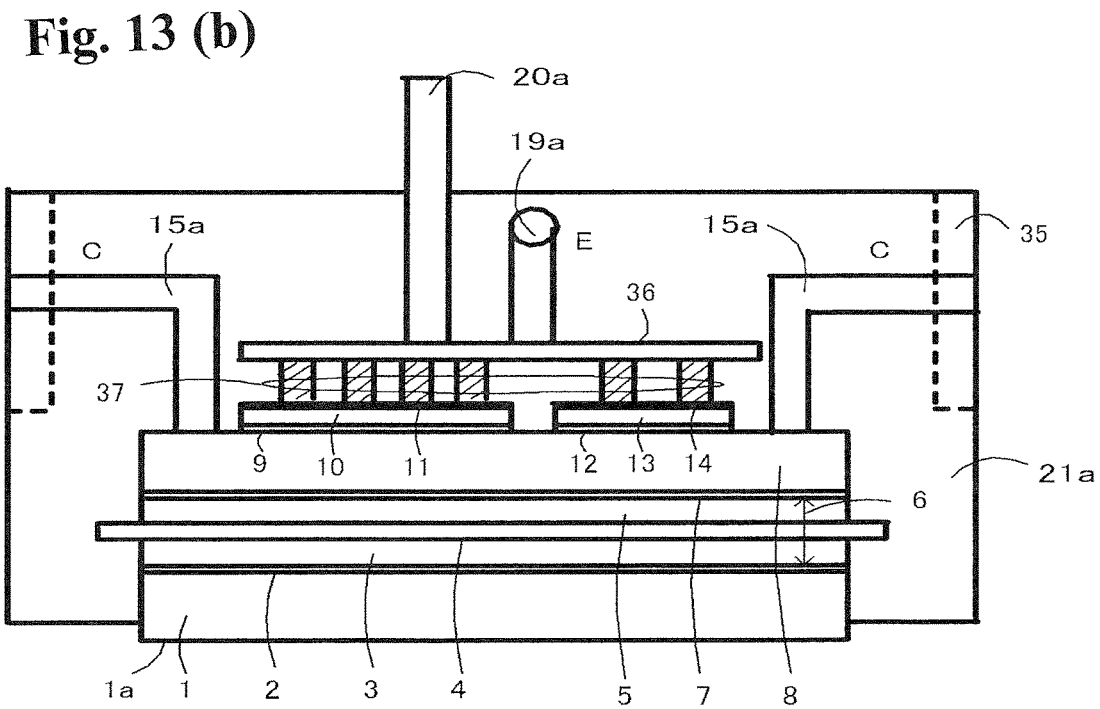

FIGS. 13(a) and 13(b) are diagrams illustrating the structure of a unit for a semiconductor device according to a third embodiment of the invention. FIG. 13(a) is a perspective view illustrating a main portion and FIG. 13(b) is a conceptual cross-sectional view. The conceptual cross-sectional view does not show the cross section of the unit taken along a specific cutting line of FIG. 13(a). A unit 300 for a semiconductor device according to this embodiment includes, for example, a unit 301 in which one IGBT chip 10 and one diode chip 13 are provided in a resin case 21a.

The unit for a semiconductor device according to this embodiment is different from the unit for a semiconductor device (FIGS. 1(a), 1(b) and 4) according to the first embodiment in that an emitter terminal pin 19a and a collector terminal pin 15a are drawn (exposed) from the side surfaces of the resin case 21a of the unit 301. The side surfaces are adjacent to the bottom from which the first copper block 1 is exposed. A control terminal pin 20a is exposed from the upper surface, similarly to the first embodiment. In FIGS. 13(a) and 13(b), reference numeral 36 indicates a printed circuit board (implant-pin-type printed circuit board) to which implant pins 37, the emitter terminal pin 19a, and the control terminal pin 20a are fixed.

As shown in FIGS. 13(a) and 13(b), the emitter terminal pins 19a are drawn from two opposite side surfaces of the resin case 21a and the collector terminal pins 15a are drawn from two opposite side surfaces which are adjacent to the two opposite side surfaces and are substantially orthogonal to each other. Concave portions 35, which are notches, are formed in the side surfaces from which the terminal pins 15a and 19a protrude.

In this embodiment, similarly to the first embodiment, a set of an IGBT chip 10 and a diode chip 13 is given as an example of the semiconductor chips provided in the unit 301, but the invention is not limited thereto. The unit for a semiconductor device may be configured so as to accommodate only the IGBT chip 10, only the diode chip 13, or chips other than the IGBT chip 10 and the diode chip 13, for example, one or two or more power MOSFET chips, power bipolar transistor chips, or thyristor chips. The chips may be determined for the purpose of use.

Since the emitter terminal pins 19a or the collector terminal pins 15a protrude from two side surfaces of the unit 301, it is possible to form a unit aggregate 401 shown in FIG. 14, which will be described below, without using the wiring substrate 28 according to the first and second embodiments. Therefore, it is possible to form a three-phase inverter circuit.

Embodiment 4

Figure 14:
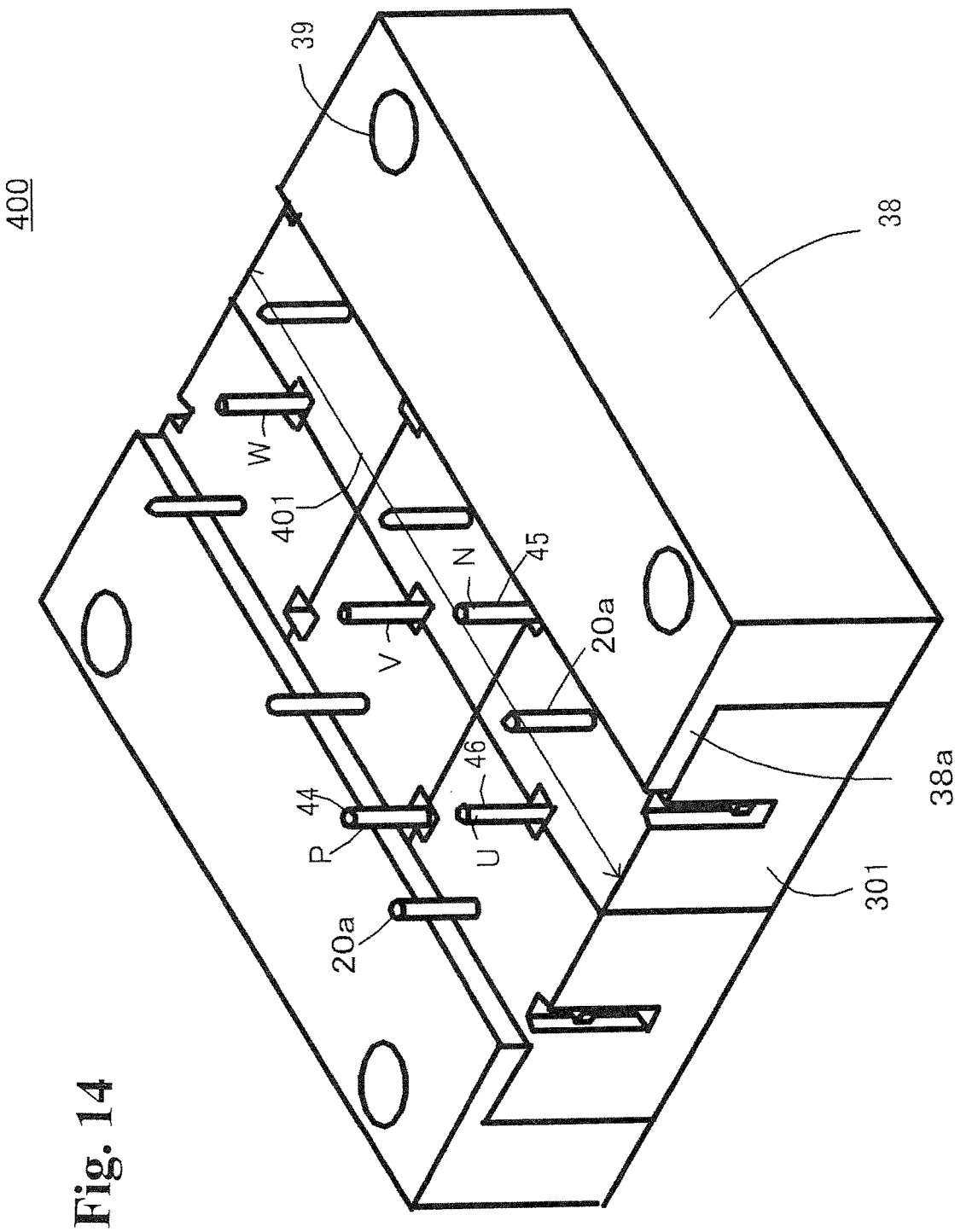
FIG. 14 is a perspective view illustrating a main portion of a semiconductor device according to a fourth embodiment of the invention.

FIG. 14 is a perspective view illustrating a main portion of a semiconductor device according to a fourth embodiment of the invention. A semiconductor device 400 is a power IGBT module. For example, one power IGBT module can form the three-phase inverter circuit shown in FIG. 6.

The semiconductor device 400 mainly includes the unit aggregate 401 including the units 301 according to the third embodiment (FIGS. 13(a) and 13(b)), collector connection terminal pins 44, emitter connection terminal pins 45, collector-emitter connection terminal pins 46, joints 40 (see FIG. 14), and bolting units 38.

The units 301 are arranged such that the collector terminal pins 15a and the emitter terminal pins 19a form, for example, a three-phase inverter circuit. As shown in FIGS. 15(a) to 15(d), which will be described below, in the joint 40, the collector connection terminal pin 44 is connected to the collector terminal pin 15a drawn from the side surface of the unit 301, the emitter connection terminal pin 45 is connected to the emitter terminal pin 19a, and the collector-emitter connection terminal pin 46 is connected to the collector terminal pin 15a and the emitter terminal pin 19a. In some cases, the collector connection terminal pin 44, the emitter connection terminal pin 45, and the collector-emitter connection terminal pin 46 are generically referred to as external connection terminal pins.

An awning 38a is provided at the upper part of the bolting unit 38 such that the bolting unit 38 has an L shape in a cross-sectional view. In addition, through holes 39 are formed in a thick portion of the bolting unit 38 and the bolting unit 38 is arranged such that the awning 38a covers a portion of the upper surface of the unit aggregate 401. The unit aggregate 401 contacts with and is fixed to a cooling body by bolts (not shown) inserted into the through holes 39.

Figure 15:
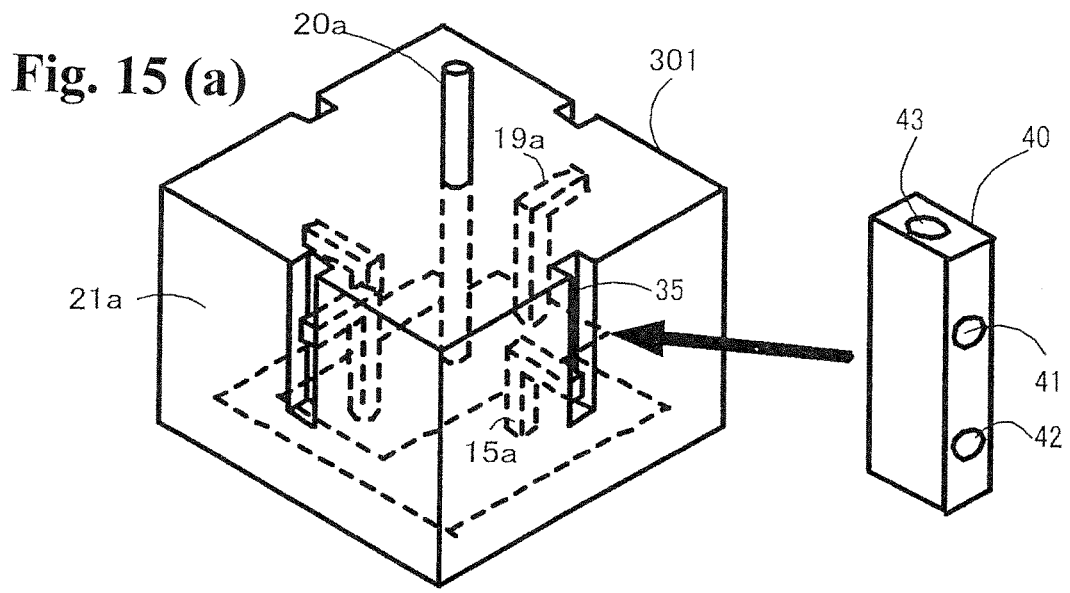
Figure 15:
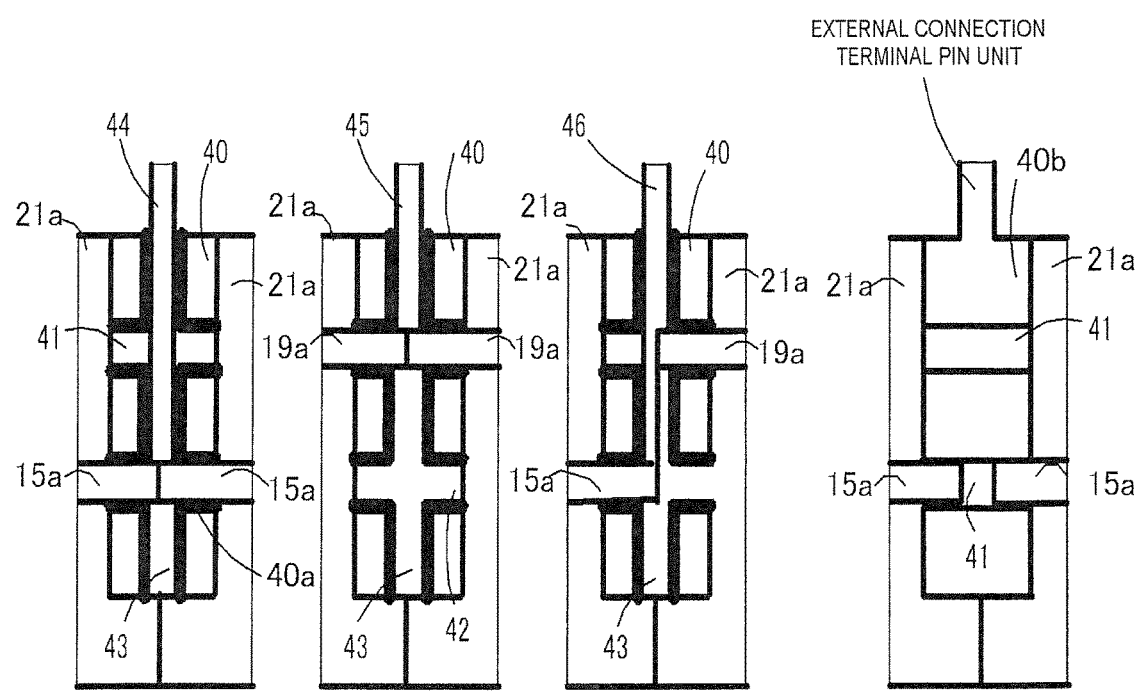

FIGS. 15(a) to 15(e) are diagrams illustrating the joint used when the units are aggregated to form the unit aggregate. FIG. 15(a) is a perspective view illustrating the joint and the unit, FIGS. 15(b) to 15(d) are cross-sectional views mainly illustrating the insertion of the terminal pin and the connection terminal pin into the joint, and FIG. 15(e) is a cross-sectional view illustrating a main portion when the joint made of metal is used.

As shown in FIG. 15(a), the joint 40 has a substantially rectangular parallelepiped shape, is made of the same resin as that forming the resin case 21a, and is provided with through holes 41, 42, and 43 into which the collector terminal pins 15a are inserted. A conductive film 40a is formed on the inner wall of each through hole and reinforces the electrical connection between the terminal pins. The joint 40 is inserted into the notched concave portion 35 formed in the resin case 21a of the unit 301 and is used to electrically and mechanically connect the units 301, thereby forming the unit aggregate 401.

As shown in FIG. 15(b), the collector terminal pins 15a drawn from adjacent resin cases 21a, that is, adjacent units 301 are inserted into the through hole 42 of the joint 40 and are then electrically connected to each other. In addition, the collector terminal pins 15a are connected to the collector connection terminal pin 44 inserted into the through hole 43.

As shown in FIG. 15(c), the emitter terminal pins 19a drawn from adjacent resin cases 21a are inserted into the through hole 41 and are then connected to each other. In addition, the emitter terminal pins 19a are connected to the emitter connection terminal pin 45 inserted into the through hole 43.

As shown in FIG. 15(d), the collector terminal pin 15a and the emitter terminal pin 19a drawn from adjacent resin case 21a are respectively inserted into the through hole 42 and the through hole 41 and are then connection to each other. In addition, the collector terminal pin 15a and the emitter terminal pin 19a are connected to the collector-emitter connection terminal pin 46 inserted into the through hole 43.

As shown in FIG. 15(e), instead of the joint 40 formed by resin molding, the external connection terminal pins may be integrated and, for example, two collector terminal pins 15a may be inserted into a through hole 42 of a joint 40b made of metal and then connected to each other.

As such, the collector connection terminal pin 44 and the emitter connection terminal pin 45 connected to the collector terminal pin 15a and the emitter terminal pin 19a serve as a P line and an N line of the three-phase inverter circuit, respectively. The collector-emitter connection terminal pin 46 connected to the collector terminal pin 15a and the emitter terminal pin 19a serves as a U line, a V line, or a W line. Therefore, the wiring substrate 28 described in the second embodiment (FIG. 5) is not needed and the manufacturing costs of a semiconductor device are reduced. As shown in FIG. 15(e), when the joint 40b is formed of metal, it is possible to significantly increase the current capacity of the joint since the joint 40b is used as a current path.

When the current-carrying capacity of the conductive film 40a formed on the inner wall of each of the through holes 41, 42, and 43 is insufficient, for example, the following structure may be used: Nanofoil (registered trademark) covers the leading ends of the terminal pins 15a and 19a and the external connection terminal pin, the terminal pins are inserted into the through holes 41, 42, and 43, and energy is given to Nanofoil by discharge or laser light to melt Nanofoil, thereby connecting the terminal pins and the external connection terminal pin. In this way, capacity is ensured and the connection is reinforced.

In the second and fourth embodiments, the semiconductor device 200 or 400 (power IGBT module) forms the three-phase inverter circuit, but the invention is not limited thereto.

In the second embodiment, the wiring pattern 29 (conductive pattern) of the wiring substrate 28 may be changed and a unit aggregate in which the arrangement of the units 101 is changed so as to correspond to the changed wiring pattern may be formed. In this way, it is possible to connect a plurality of units in parallel or series to each other, connect a high-side element and a low-side element in series to form one arm, or form a single-phase inverter circuit.

In the fourth embodiment, the arrangement of the units 301 is changed to form the unit aggregate 401. In this way, it is possible to obtain various kinds of circuits.

When the number of units 100 or 300 for a semiconductor device increases, current capacity increases and it is possible to form a three-level inverter circuit or an invert circuit including a PWM converter.

Embodiment 5

(Structure of Semiconductor Device)

Figure 16:
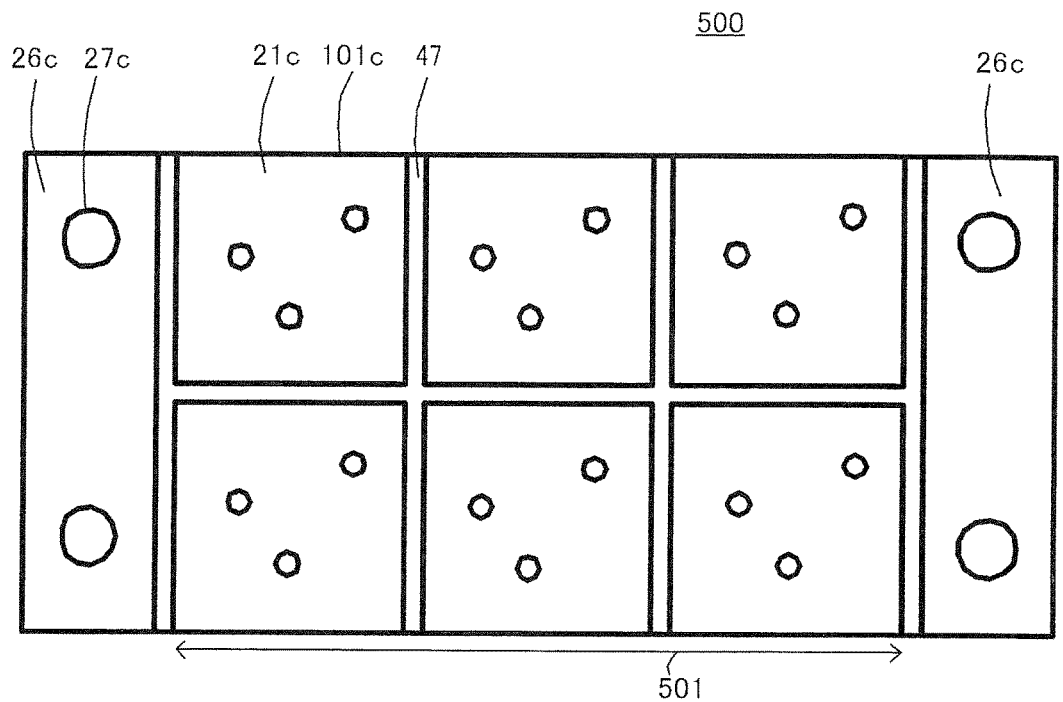
Figure 16:
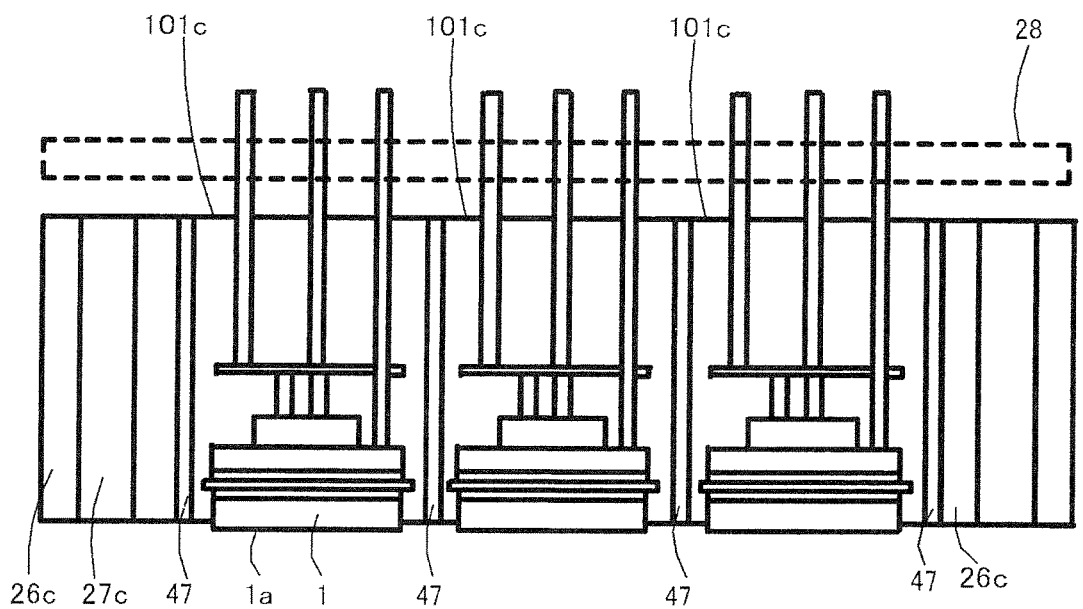
Figure 17:
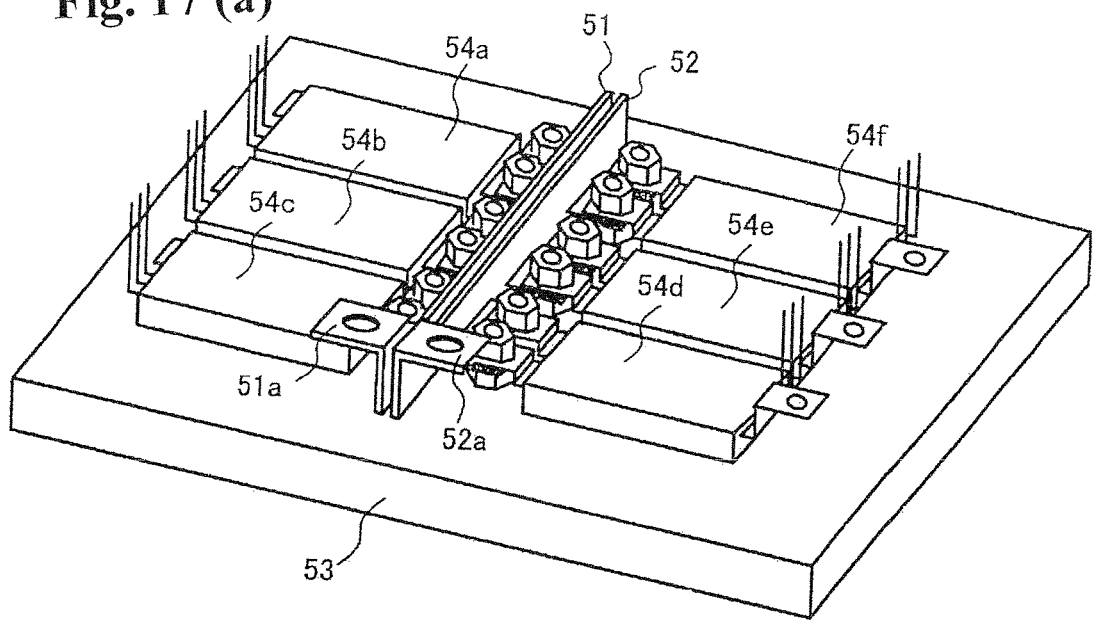
Figure 17:
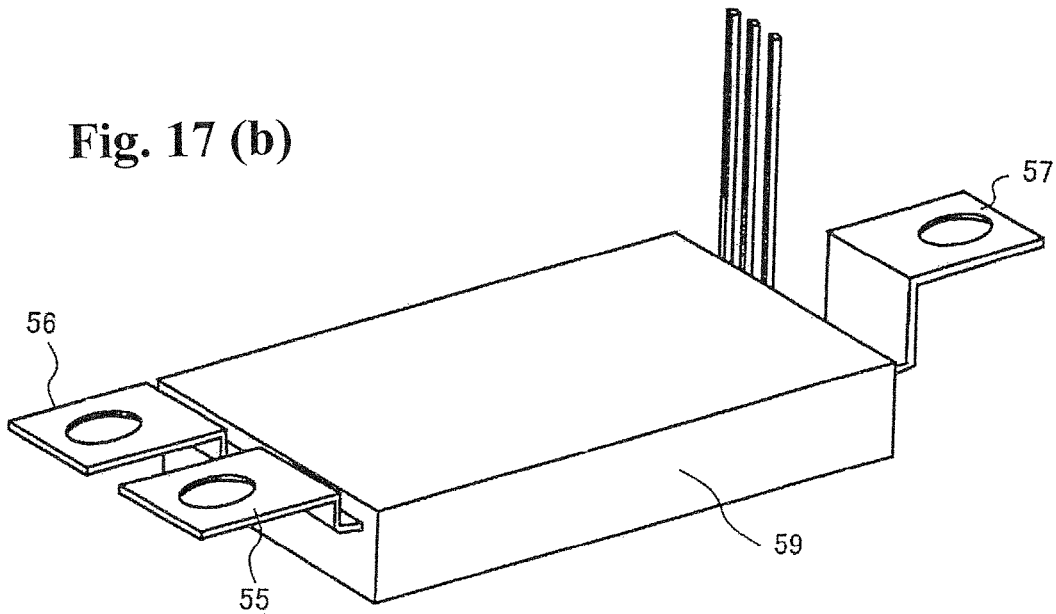

FIGS. 16(a) and 16(b) are diagrams illustrating the structure of a semiconductor device according to a fifth embodiment of the invention. FIG. 16(a) is a plan view illustrating a main portion and FIG. 16(b) is a cross-sectional view illustrating a main portion. A semiconductor device 500 is a power semiconductor module in which units 101c corresponding to the units 101 according to the first embodiment (FIGS. 1(a), 1(b)) are bonded to each other by an adhesive 47 to form a unit aggregate 501 corresponding to the unit aggregate 201 according to the second embodiment (FIG. 5) and the unit aggregate 501 is used to form a three-phase inverter circuit. However, components sealed in a resin case 21c of the unit 101c are the same as those sealed in the resin case 21 of the unit 101 according to the first embodiment.

This embodiment is different from the second embodiment (FIG. 5) in that the adhesive 47 is filled between the units 101c which are arranged in a matrix of two rows and three columns and between opposite surfaces of the unit 101c and a bolting unit 26c to fix the units 101c, and the unit 101c and the bolting unit 26c.

It is preferable that each first copper block 1 of the unit aggregate 501 be polished such that the rear surfaces 1a have the same height and are flush with each other. The unit aggregate 501 in which the rear surface 1a of each first copper block 1 is planarized is closely fixed to a cooling body (not shown) by bolts which are inserted into through holes 27c of the bolting units 26c and is then used.

(Method of Manufacturing Semiconductor Device)

Next, a method of manufacturing the semiconductor device 500 shown in FIGS. 16(a) and 16(b) will be described.

First, the unit 101c, the bolting unit 26c, and the wiring substrate 28 which are the same as those in the first embodiment (FIGS. 1(a) and 1(b)) and the second embodiment (FIG. 5) are prepared. Then, a predetermined amount of phenol-novolac-based epoxy resin and a predetermined amount of acid anhydride curing agent are sufficiently mixed at room temperature and the mixture is primarily defoamed in a vacuum of 13.3 Pa (0.1 Torr) for 10 minutes to produce an adhesive. A necessary amount of adhesive 47 is coated between the units 101c and on the adhesive surfaces of the unit 101c and the bolting unit 26c. Then, the units 101c are arranged in a matrix of 2 rows and 3 columns and the bolting units 26c are arranged such that the units 101c are interposed between the bolting units 26c in the longitudinal direction. Then, the bolting units 26c and the units 101c are combined in a mold (not shown) and an appropriate pressing force is applied to the adhesive surface. Then, the adhesive is cured under the curing conditions of 100° C. and 1 hour. When the combined structure is separated from the mold, a secondary curing process is performed on the structure at a temperature of 180° C. for 2 hours to increase the heat resistance of the adhesive 47 between the units. In this way, the unit aggregate 501 is formed.

Then, the rear surfaces 1a of the first copper blocks 1 in the unit aggregate 501 are polished and the wiring substrate 28 is arranged on the unit aggregate 501. Then, the emitter terminal pin 19, the collector terminal pin 15, and the control terminal pin 20 pass through the wiring substrate 28 and are then fixed. In this way, the semiconductor device 500 forming the three-phase inverter circuit is completed.

Then, the semiconductor device 500 is fixed to the cooling body onto which thermal conductive paste (not shown) is applied by bolts and is then used.

Since the units 101c are fixed by the adhesive 47, it is possible to form an integrated unit aggregate 501 and it is easy to attach the semiconductor device 500 to the cooling body.

It is preferable that the adhesive 47 be made of a base resin, which is a sealing material forming the resin case 21c, or an equivalent to the base resin. That is, when the adhesive 47 is made of the base resin used in the sealing material or an equivalent to the base resin and the material forming the adhesive 47 does not include a filler, it is possible to make adhesion strength or a heat distortion temperature suitable for a thermal expansion coefficient suitable for the sealing material forming the resin case 21c. In this way, it is possible to insert the adhesive 47 into a narrow space and thus improve the adhesion strength of the adhesive 47. Since the same material is basically used, the resin case 21c and the adhesive 47 are integrated with each other after the adhesive 47 is cured. Therefore, the adhesion strength is significantly improved.

In addition, the thermal expansion coefficient of the sealing material forming the resin case 21c is equal to that of the copper block 1 or 8 and the adhesion strength of the adhesive 47 increases to maintain the heat distortion temperature to be high. In this way, it is possible to prevent the occurrence of thermal stress and thus prevent an increase in the thermal resistance of a soldering portion.

It is preferable that the exposed rear surface 1a of the first copper block 1 of each unit 101c be polished and planarized after the unit aggregate 501 is assembled. In this case, it is possible to improve the adhesion between the cooling body and the rear surface 1a of each unit 101c and thus improve heat dissipation efficiency.

(Sealing Material)

Next, the sealing material forming the resin case 21c of the unit 101c will be described. However, the internal members of the unit 101c are the same as those of the unit 101 according to the first embodiment.

It is preferable that the thermal expansion coefficient of the sealing material be in a range of $1.5 \times 10^{-5}$/° C. to $1.8 \times 10^{-5}$/° C. The thermal expansion coefficient of the sealing material is substantially equal to that of the copper block. When the sealing material is used, it is possible to prevent the warping of the insulating substrate 6 with a conductive pattern to which the copper blocks 1 and 8 are fixed and an increase in thermal resistance due to the thermal fatigue of the solder materials 9, 11, 12, and 14 (see FIG. 1(b)) provided on the upper and lower surfaces of the IGBT chip 10 and the diode chip 13. As a result, it is possible to provide a power IGBT module with high reliability. When the thermal expansion coefficient is less than $1.5 \times 10^{-5}$/° C., the content of the filler needs to be equal to or more than 90 wt %. In this case, the fluidity of a casting material is lost and it is difficult to perform a sealing operation. On the other hand, when the thermal expansion coefficient is more than $1.8 \times 10^{-5}$/° C., it is difficult to reduce thermal stress between the insulating substrate 6 with a conductive pattern and the IGBT chip 10 and the diode chip 13.

It is preferable that the adhesion strength of the sealing material to the copper blocks 1 and 8 be in a range of 10 MPa to 30 MPa. When the sealing material is used, it is possible to prevent the warping of the insulating substrate 6 with a conductive pattern to which the copper blocks 1 and 8 are fixed and an increase in thermal resistance due to the thermal fatigue of the solder materials provided on the upper and lower surfaces of the chips. As a result, it is possible to provide a power IGBT module with high reliability. When the adhesion strength is less than 10 MPa, peeling-off occurs at the interface between the sealing material and the copper blocks 1 and 8, or the IGBT chip 10 and the diode chip 13 and sufficient adhesion strength is not obtained. Therefore, it is difficult to guide the IGBT chip 10 and the diode chip 13 from thermal stress. The upper limit of the adhesion strength is substantially 30 MPa.

In addition, it is preferable that the heat distortion temperature of the sealing material be in a range of 150° C. to 200° C. When the sealing material is used, it is possible to prevent the warping of the insulating substrate 6 with a conductive pattern to which the copper blocks 1 and 8 are fixed and an increase in thermal resistance due to the thermal fatigue of the solder materials 9, 11, 12, and 14 provided on the upper and lower surfaces of the IGBT chip 10 and the diode chip 13. As a result, it is possible to provide a power IGBT module with high reliability. When the heat distortion temperature is less than 150° C., the resin case 21c does not have heat resistance and the function of the sealing material is lost. The upper limit of the temperature range of an epoxy-based sealing material is in a range of 200° C. to 225° C. Therefore, the heat distortion temperature of the epoxy-based sealing material is set to 200° C. or less, considering a margin.

As a material satisfying the above-mentioned conditions, there is, for example, a two-liquid mixture type sealing material of a phenol-novolac-based epoxy resin and an acid anhydride curing agent. A sealing material for cast obtained by mixing 75 wt % of silica filler with the two-liquid mixture type sealing material is available from Nagase ChemteX Corporation. For example, a predetermined amount of epoxy resin and a predetermined amount of curing agent are heated at a temperature of 70° C. and then sufficiently mixed. Then, the mixture is primarily defoamed in a vacuum of 0.1 Torr for 10 minutes and is then injected into a mold. In addition, the mixture is secondarily defoamed in a vacuum of 0.1 Torr for 10 minutes, is heated at a temperature of 100° C. for one hour, and is then cured to form the resin case 21c. The thermal expansion coefficient of the cured sealing material is $1.7 \times 10^{-5}$/° C., the adhesion strength of the sealing material to the copper block is 23 MPa, and the heat distortion temperature of the sealing material is 200° C.

The sealing material may also be used for the resin cases 21, 21a, and 23 according to the first to fourth embodiments.

(Adhesive)

Next, the adhesive 47 for bonding, for example, the units 101c will be described.

It is preferable that the adhesion strength of the adhesive to the resin case 21c and the bolting unit 26c be in a range of 10 MPa to 30 MPa. When the adhesive having the above-mentioned adhesion strength range is used, it is possible to prevent peeling-off at the interface with the resin case 21c or the bolting unit 26c and thus a strong integrated unit aggregate 501. When the adhesion strength is less than 10 MPa, peeling-off is likely to occur at the interface with the resin case 21c or the bolting unit 26c. The upper limit of the adhesion strength is 30 MPa.

It is preferable that the heat distortion temperature of the adhesive be in a range of 150° C. to 200° C. When the heat distortion temperature is in the above-mentioned range, it is possible to strongly bond the resin case 21c or the bolting unit 26c and thus form an integrated unit aggregate 501 with high heat resistance. As a result, it is possible to safely use the semiconductor chip provided in the resin case 21c up to a rated bonding temperature. When the heat distortion temperature is less than 150°, it is difficult to strongly bond the resin case 21c or the bolting unit 26c and the rated bonding temperature of the semiconductor chip needs to be reduced. Since the upper limit of the use temperature of the epoxy-based adhesive is in a range of 200° C. to 225° C., the heat distortion temperature of the adhesive is set to 200° C. or less, considering a margin.

As a material satisfying the above-mentioned conditions, there is, for example, a two-liquid mixture type material of a phenol-novolac-based epoxy resin and an acid anhydride curing agent, which has been described above. A base material without including a filler material is available from Nagase ChemteX Corporation.

When an elastic body, such as a rubber sheet, is additionally inserted between the unit aggregate 501 and the wiring substrate 28, it is possible to obtain the same effect as that in the second embodiment (FIG. 7).

The principle of the invention has been simply described above. It will be understood by those skilled in the art that various modifications and changes of the invention can be made, and the invention is not limited to the above-mentioned accurate structure and applications. All corresponding modifications and equivalents are regarded as the scope of the invention defined by the appended claims and equivalents thereof.

REFERENCE NUMERALS

1: FIRST COPPER BLOCK
1a: REAR SURFACE
2, 7, 9, 11, 12, 14: SOLDER
2a, 7a, 9a, 11a, 12a, 14a: SOLDER PLATE
3: CONDUCTIVE PATTERN
4: INSULATING SUBSTRATE
5: CONDUCTIVE PATTERN
6: INSULATING SUBSTRATE WITH CONDUCTIVE PATTERN
8: SECOND COPPER BLOCK
10: IGBT CHIP
13: DIODE CHIP
15, 15a: COLLECTOR TERMINAL PIN
16, 36: PRINTED CIRCUIT BOARD
16a: THROUGH HOLE
17, 37: IMPLANT PIN
19, 19a: emitter terminal pin
20, 20a: control terminal pin
21, 21a, 23, 21c: RESIN CASE
22: REFLOW FURNACE
24: CONCAVE PORTION
25: CONVEX PORTION
26, 26c, 38: BOLTING UNIT
27, 27C, 30, 31, 39, 41, 42, 43: THROUGH HOLE
28: WIRING SUBSTRATE
29: WIRING PATTERN
32: BOLT
35: CONCAVE PORTION
38a: AWNING
40, 40b: JOINT
40a: CONDUCTIVE FILM
44: COLLECTOR CONNECTION TERMINAL PIN
45: EMITTER CONNECTION TERMINAL PIN
46: COLLECTOR-EMITTER CONNECTION TERMINAL PIN
47: ADHESIVE
48: COOLING BODY
49: ELASTIC BODY
100, 300: UNIT FOR A SEMICONDUCTOR DEVICE
200, 200a, 400, 500: SEMICONDUCTOR DEVICE
101, 101c, 102, 301: UNIT
101a: LAMINATE
201, 202, 401, 501: UNIT AGGREGATE

What is claimed is:

1. A unit for a semiconductor device, comprising:
an insulating substrate having a first conductive pattern formed on one surface thereof and a second conductive pattern formed on the other surface which is a side opposite to the one surface across the insulating substrate;
a first conductive block formed on the first conductive pattern;
a second conductive block formed on the second conductive pattern so that the second conductive block is arranged on a side opposite to the first conductive block across the insulating substrate;

a semiconductor chip having one surface fixed to the second conductive block;
a plurality of implant pins fixed to the other surface of the semiconductor chip;
a printed circuit board having a third conductive pattern formed thereon and the implant pins fixed thereon;
a first external lead terminal fixed to the second conductive block;
a second external lead terminal fixed to the third conductive pattern and electrically connected to the implant pins; and
a resin case covering the first conductive block, the second conductive block, and the insulating substrate, and sealing such that the first conductive block is exposed from a first surface of the resin case and ends of the first and second external lead terminals protrude from a second surface at an opposite side of the first surface.

2. The unit for a semiconductor device according to claim 1, wherein the first external lead terminal has two terminals; the second external lead terminal has two terminals; and the resin case seals such that the first conductive block is exposed from the first surface thereof, ends of the terminals of the first external lead terminal protrude from a second surface adjacent to the first surface and a third surface opposite to the second surface, and ends of the terminals of the second external lead terminal protrude from a fourth surface adjacent to the first surface and a fifth surface at an opposite side of the fourth surface.

3. The unit for a semiconductor device according to claim 1, wherein the semiconductor chip is an IGBT chip, a diode chip, a power MOSFET chip, a power bipolar transistor chip, or a thyristor chip.

4. The unit for a semiconductor device according to claim 1, wherein the semiconductor chip is an IGBT chip and a diode chip electrically inverse-parallel connected, or an MOSFET chip and a diode chip inverse-parallel connected, through the second conductive block and the third conductive pattern.

5. The unit for a semiconductor device according to claim 1, wherein the first conductive block protrudes outwardly from the first surface of the resin case covering the first conductive block.

6. The unit for a semiconductor device according to claim 1, wherein a lower surface of the resin case is located at the lateral sides of the first conductive block, and the surface of the first conductive block opposite to the surface on which the first conducive pattern is fixed is located below the lower surface of the resin case.

7. The unit for a semiconductor device according to claim 1, wherein the first and second external lead terminals are terminal pins extending outwardly from the unit.

8. The unit for a semiconductor device according to claim 7, wherein the first external lead terminal fixed on the second conductive block passes through a hole of the printed circuit board and extends outside the resin case.

9. The unit for a semiconductor device according to claim 1, further comprising a solder formed separately from the first conductive block and the first conductive pattern, and connecting the first conductive block and the first conductive pattern, and
another solder formed separately from the second conductive block and the second conductive pattern, and connecting the second conductive block and the second conductive pattern.

10. The unit for a semiconductor device according to claim 9, wherein the first conductive block and the second conductive block are copper blocks, respectively.

11. The unit for a semiconductor device according to claim 1, wherein the first conductive block formed on the first conductive pattern is located at a side opposite to the second conductive block across the first conductive pattern.

12. The unit for a semiconductor device according to claim 11, wherein the first conductive block located under the second conductive block and the semiconductor chip is exposed from the first surface of the resin case.

* * * * *